(12) United States Patent
Hozoji et al.

(10) Patent No.: US 7,393,771 B2
(45) Date of Patent: Jul. 1, 2008

(54) METHOD FOR MOUNTING AN ELECTRONIC PART ON A SUBSTRATE USING A LIQUID CONTAINING METAL PARTICLES

(75) Inventors: Hiroshi Hozoji, Hitachiohta (JP); Toshiaki Morita, Hitachi (JP); Hiroshi Sasaki, Mito (JP)

(73) Assignee: Hitachi, Ltd., Tokyo (JP)

( * ) Notice: Subject to any disclaimer, the term of this patent is extended or adjusted under 35 U.S.C. 154(b) by 210 days.

(21) Appl. No.: 10/996,038

(22) Filed: Nov. 24, 2004

(65) Prior Publication Data
US 2006/0267218 A1 Nov. 30, 2006

(30) Foreign Application Priority Data
Jun. 29, 2004 (JP) .............................. 2004-190639

(51) Int. Cl.
*H01L 21/44* (2006.01)
(52) U.S. Cl. ................. 438/610; 257/779; 257/E23.112
(58) Field of Classification Search ................. 257/779, 257/E23.112; 438/610
See application file for complete search history.

(56) References Cited

U.S. PATENT DOCUMENTS

| 5,162,087 | A | * | 11/1992 | Fukuzawa et al. ........... 252/512 |
| 5,780,931 | A | * | 7/1998 | Shimoda et al. ............. 257/779 |
| 6,297,564 | B1 | * | 10/2001 | Chung ........................ 257/783 |
| 6,519,842 | B2 | * | 2/2003 | Fukunaga et al. ............. 29/840 |
| 2003/0096089 | A1 | * | 5/2003 | Huang et al. ................. 428/209 |
| 2004/0043334 | A1 | * | 3/2004 | Kobayashi et al. .......... 430/315 |
| 2004/0245648 | A1 | * | 12/2004 | Nagasawa et al. ........... 438/612 |
| 2005/0042838 | A1 | * | 2/2005 | Garyainov et al. .......... 438/455 |

* cited by examiner

*Primary Examiner*—Thao X. Le
*Assistant Examiner*—Ajay K Arora
(74) *Attorney, Agent, or Firm*—Crowell & Moring LLP

(57) ABSTRACT

An electronic part mounting method, a semiconductor module, and a semiconductor device, which can reduce a mounting area and a device thickness. In an electronic part mounting method for bonding an electrode formed on a substrate and an electrode formed on an electronic part to each other, the method comprises the step of bonding both the electrodes through a metal layer made up of aggregated particles of at least one kind of metal. Then, the metal particles have an average particle size of 1 to 50 nm. Preferably, the metal particles form a metal layer having a thickness of 5 to 100 μm.

13 Claims, 15 Drawing Sheets

COATING

DRYING

PLACING OF CHIP

MOUNTIG OF CHIP
(BONDING OF CHIP
AND SUBSTRATE)

PLACING AND MOUNTING
OF PASSIVE PARTS

POURING OF EPOXY
REGIN FOR PACKAGING

MOUNTING OF SUBSTRATE
ON WRITING BOARD

METHOD FOR MOUNTING AN ELECTRONIC PART ON A SUBSTRATE USING A LIQUID CONTAINING METAL PARTICLES

BACKGROUND OF THE INVENTION

1. Field of the Invention

The present invention relates to an electronic part mounting method, a semiconductor module, and a semiconductor device.

2. Description of the Related Art

Usually, a high-frequency power amplifier is incorporated in a portable communication unit represented by a car phone or a cellular phone based on the PDC (Personal Digital Cellular) system, or a cellular phone based on the PHS (Personal Handy-phone System). As well known, the high-frequency power amplifier is constituted as a semiconductor module, and it is a multistage amplifier comprising a plurality of amplifiers interconnected in multiple stages.

Such a high-frequency power amplifier is formed on one principal surface of a semiconductor chip, and the semiconductor chip including the amplifier is mounted on one principal surface of a wiring board. Electrodes formed on the one principal surface of the semiconductor chip and electrodes formed on the one principal surface of the wiring board are connected to each other by conductive wires.

More specifically, the high-frequency power amplifier comprises, for example, a plurality of field effect transistors electrically connected in parallel. A gate terminal serving as an input portion of the high-frequency power amplifier is electrically connected to a chip-side input electrode formed on the one principal surface of the semiconductor chip.

On the other hand, a drain terminal serving as an output portion of the high-frequency power amplifier is electrically connected to a chip-side output electrode formed on the one principal surface of the semiconductor chip. The chip-side input electrode is arranged at one side of the semiconductor chip, and the chip-side output electrode is arranged at another side of the semiconductor chip, which is positioned in opposite relation to the one side.

A source terminal of the high-frequency power amplifier is electrically connected to a rear-side electrode formed on another surface (i.e., a rear surface) of the semiconductor chip, which is positioned in opposite relation to the one principal surface of the semiconductor chip. The rear electrode is fixedly held at a reference potential. The chip-side input electrode is electrically connected, by an input wire, to a board-side input electrode formed on the one principal surface of the wiring board in facing relation to the one side of the semiconductor chip. The chip-side output electrode is electrically connected, by an output wire, to a board-side output electrode formed on the one principal surface of the wiring board in facing relation to the other side of the semiconductor chip.

One practical semiconductor module is described in "Hitachi Hyoron", No. 4, 1993, pp. 12-26. published Apr. 25, 1993 by Hitachi Hyoron Co. In this semiconductor module (i.e., a MOS power module for the high-frequency power amplifier), power MOSFET's are incorporated in three stages to increase an output.

Non-Patent Reference 1 further discusses various types of semiconductor modules in the packaged form. The semiconductor module assembled in a cellular phone employs a metallic cover and surface mounting for the purpose of size reduction.

FIG. 15 shows the structure of a known semiconductor module employing a metallic cover (hereinafter referred to as a "cap") and the surface mounting. A glass-ceramic substrate 202 is fixed to a principal surface (upper surface) of a heat radiating flange 201 in the form of a rectangular plate by using a solder (not shown).

Active parts, such as power MOSFET's (not shown), and passive parts, such as resistances and capacitors (not shown), are mounted on a principal surface (upper surface) of the substrate 202. The active parts, such as the power MOSFET's, are connected to external terminals by wire bonding.

Further, a cap 203 is attached to the heat radiating flange 201 so as to cover the principal surface of the glass-ceramic substrate 202. Openings are formed in one side surface of the cap 203, and leads 204 having inner ends fixed to the glass-ceramic substrate 202 are led out through the openings. Fins 205 for face fixing are each disposed to project in the form of one step (i.e., an L-like bent shape) outward from a side edge of the heat radiating flange 201.

The fins 205 for face fixing not only serve to transmit heat to a chassis (not shown) on which a high-frequency power module 206 is mounted, but also function as a ground pin. The heat radiating flange 201 is electrically connected to ground wiring on the principal surface of the glass-ceramic substrate 202 through a conductor filled in a through hole formed in the glass-ceramic substrate 202.

JP-A-10-50926 discloses a heat radiating module in which a heat-generating circuit part is placed in a recess formed in a circuit board, and solder bumps of the circuit part are soldered to land electrodes of a circuit board. Further, the thus-obtained circuit board is mounted on a mother circuit board through a heat conductive member, and terminal electrodes provided on a side surface of the circuit board are soldered to land electrodes on the mother circuit board, thereby transmitting the heat generated from the circuit part to the mother circuit board for the purpose of heat radiation.

Meanwhile, in a non-insulation semiconductor device as one of power semiconductor devices for use in inverters, etc., a member used for fixing a semiconductor element serves also as one electrode of a semiconductor device. For example, in a semiconductor device including a power transistor mounted on a fixing member (made of, e.g., a copper—cuprous oxide composite material) by using an Sn—Pb brazing paste, the fixing member (base material) serves also as a collector electrode of the power transistor.

In actual operation, a collector current of several amperes or more flows, whereupon a transistor chip generates heat. To avoid the generated heat from causing instability of characteristics and shortening of the life, the base material is required to have superior heat dissipation and to ensure reliability in a brazed portion. Then, ensuring reliability in the brazed portion requires matching in thermal expansion rate between the semiconductor element and the fixing member.

Also in an insulation semiconductor device, from the viewpoint of realizing the safe and stable operation of the semiconductor element, it is required to efficiently dissipate the heat generated during the operation of the semiconductor device to the outside of a package, and to ensure reliability in the brazed portion.

To clear those conditions, JP-A-8-11503) discloses a semiconductor current controller in which an assembly obtained by mounting a Si chip on a Cu-coated AlN board is integrally brazed to a support member made of Mo by using a solder. With this disclosed technique, since the Cu-coated AlN board is soldered to the Mo support member having a thermal expansion rate (5.1 ppm/° C.) comparable to that of the Cu-coated AlN board, a soldered portion between both the members has superior reliability.

Patent Reference 3 (JP-B-7-26174) discloses a semiconductor module device in which an assembly obtained by mounting a thyristor chip on an alumina board is mounted to a support member made of a composite material in which SiC ceramic powder is dispersed in Al or an Al alloy. With this disclosed technique, since the alumina board is mounted to the support member made of the Al/SiC composite material having a thermal expansion rate (2 to 13 ppm/° C.) comparable to that (7.5 ppm/° C.) of the alumina board, a bonded portion between both the members has superior reliability.

SUMMARY OF THE INVENTION

A known semiconductor module has a small size. For example, a body of the semiconductor module 206 comprising the heat radiating flange 201 and the cap 203, as shown in FIG. 15, has dimensions of 21 mm length, 10 mm width and 3.7 mm height.

However, the semiconductor module 206 has the fins 205 for face fixing, which are disposed at a module periphery and each of which has a length of, e.g., about 2 mm. The fins 205 for face fixing are positioned at three sides of the high-frequency power module 206. Therefore, the presence of the fins 25 hinder a further reduction of a mounting area.

Also, bonding wires for connecting the active parts and the external wiring to each other hinder a reduction of the height of the semiconductor module and hence a further reduction of the thickness.

Moreover, in the heat radiating module disclosed in the above-cited publication, an Sn-based solder is used to bond not only the circuit board and the circuit part together, but also the circuit part and the mother circuit board together. It is therefore difficult to set the bonding temperatures for them in a hierarchical way.

On the other hand, in the semiconductor device mounting the power semiconductor element thereon, because an Sn-based material having a relatively low melting point, such as an Sn-Pb eutectic material, is used as the solder, the semiconductor device cannot be employed under environment at high temperatures (not lower than, e.g., 180° C.).

It is an object of the present invention to provide an electronic part mounting method, a semiconductor module, and a semiconductor device, which can reduce a mounting area and a device thickness.

Another object of the present invention is to provide an electronic part mounting method, a semiconductor module, and a semiconductor device, which will not impair reliability for a long term even under environment at high temperatures.

According to one aspect, the present invention provides an electronic part mounting method for bonding an electrode formed on a substrate and an electrode formed on an electronic part to each other, the method comprising the step of bonding both the electrodes through a metal layer made up of aggregated particles of at least one kind of metal. Then, the metal particles have an average particle size of 1 to 50 nm. Preferably, the metal particles form a metal layer having a thickness of 5 to 100 μm.

Preferably, the metal particles are made of Au, an Au alloy, Ag, and/or an Ag alloy.

Preferably, the metal particles comprise cores and coatings formed on core surfaces. The cores may be Ni particles and the core surfaces may be plated with Au, an Au alloy, Ag, and/or an Ag alloy. Instead of the Ni particles, the cores may be particles having characteristics causing neither deformation nor decomposition even under temperatures applied in drying and bonding steps performed after coating the particles on core surfaces. As an alternative, the cores may be Cu particles, core surfaces may be plated with Ni, and Ni-plated surface layers may be plated with Au, an Au alloy, Ag, and/or an Ag alloy. Instead of the Cu particles, the cores may be particles having characteristics causing neither deformation nor decomposition even under temperatures applied in drying and bonding steps performed after coating the particles on core surfaces.

According to another aspect, the present invention provides an electronic part mounting method comprising the steps of coating a liquid containing metal particles, which are made of at least one kind of metal selected from among Au and Ag and have an average particle size of 1 to 50 nm, on a substrate having an electrode with a metal layer of Au or an Au alloy formed on an electrode surface; heating the liquid after the coating step, thereby forming an area made of aggregated metal particles on the electrode surface layer of Au or an Au alloy; and cooling the substrate after the heating step, placing an electronic part on the area made of the aggregated metal particles, and reheating the area at 50 to 300° C. to bond the metal particles and the electronic part, thereby electrically connecting the electrode on the substrate and the electronic part.

According to still another aspect, the present invention provides an electronic part mounting method comprising the steps of forming a water repellent layer on a substrate having an electrode on a substrate surface; forming an area where the water repellent layer is removed, at a predetermined position corresponding to the electrode; coating a liquid containing metal particles, which are made of at least one kind of metal selected from among Au and Ag and have an average particle size of 1 to 50 nm, in the area where the water repellent layer is removed; heating the liquid after the coating step, thereby forming an area made of aggregated metal particles on the electrode having a surface layer of Au or an Au alloy; and cooling the substrate after the heating step, placing an electronic part on the area made of the aggregated metal particles, and reheating the area at 50 to 300° C. to bond the metal particles and the electronic part, thereby electrically connecting the electrode on the substrate and the electronic part.

Preferably, the water repellent layer is made of an amorphous fluorine-containing polymer having, in a molecule thereof, a perfluoro-polyether chain and an alkoxy silane residual group, or fluoro-alkyl chain and an alkoxy silane residual group. Alternatively, the water repellent layer is made of an amorphous fluorine-containing polymer having, in a molecule thereof, a perfluoro-polyether chain and an alkoxy silane residual group, or fluoro-alkyl chain and an alkoxy silane residual group.

According to still another aspect, the present invention provides an electronic part mounting method comprising the step of forming a recess on one surface of a substrate; forming, on a bottom surface of the recess, a metal layer made up of at least one kind of metal particles that have an average particle size of 1 to 50 nm and are selected from among Au, an Au alloy, Ag, and an Ag alloy; and connecting the substrate and a terminal provided on one surface of an electronic part to each other through the metal layer.

According to still another aspect, the present invention provides a semiconductor module wherein an electrode formed on a substrate and an electrode formed on an electronic part are bonded to each other through a metal layer made up of aggregated particles of at least one kind of metal. Preferably, an electrode formed on a substrate and an electrode formed on an electronic part are bonded to each other through a metal layer made up of particles being made of at least one kind of metal selected from among Au and Ag and having an average particle size of 1 to 50 nm.

According to still another aspect, the present invention provides a semiconductor module having a structure in which a plurality of semiconductor elements are connected through a first connecting material to a substrate having an electrode formed thereon, and the substrate is connected to an external mounting board through a second connecting material, the second connecting material being a metal layer made up of aggregated particles of at least one kind of metal selected from among Au and Ag. Preferably, the first connecting material is one of a brazing material containing Sn as a main component and a lead-free solder material.

According to still another aspect, the present invention provides a semiconductor device wherein an electrode formed on a substrate surface and an electrode formed on an electronic part surface are bonded to each other through a metal layer made up of particles having an average particle size of 1 to 50 nm and having an average particle size of 1 to 100 μm, the particles being made of at least one kind of metal selected from among Au and Ag. In the semiconductor device, preferably, the metal particles having an average particle size of 1 to 100 μm are formed by coating layers of Au or an Au alloy on surfaces of nickel particles, or the minute particles having an average particle size of 1 to 50 nm are coupled to surfaces of the particles having an average particle size of 1 to 100 μm.

Thus, the present invention can provide the electronic part mounting method, the semiconductor module, and the semiconductor device, which can reduce a mounting area and a device thickness.

Also, the present invention can provide the electronic part mounting method, the semiconductor module, and the semiconductor device, which will not impair reliability for a long term even under environment at high temperatures.

DESCRIPTION OF THE PREFERRED EMBODIMENTS

Embodiments of the present invention will be described below with reference to the accompanying drawings.

First Embodiment

Figure 1:
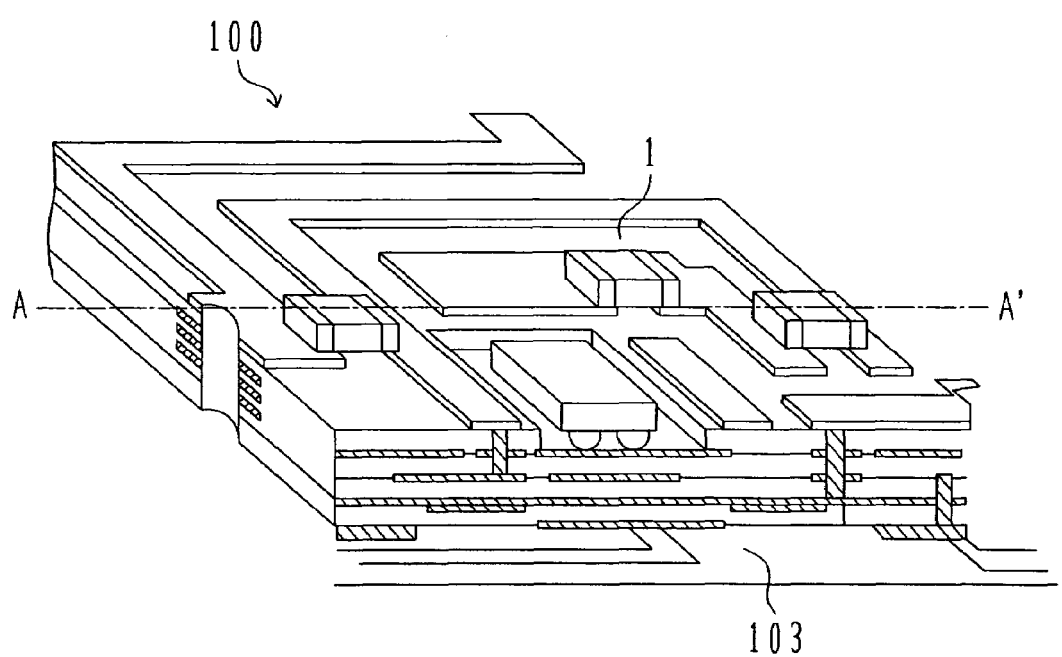
FIG. 1 is a schematic view showing the construction of a semiconductor module according to one embodiment.
Figure 2:
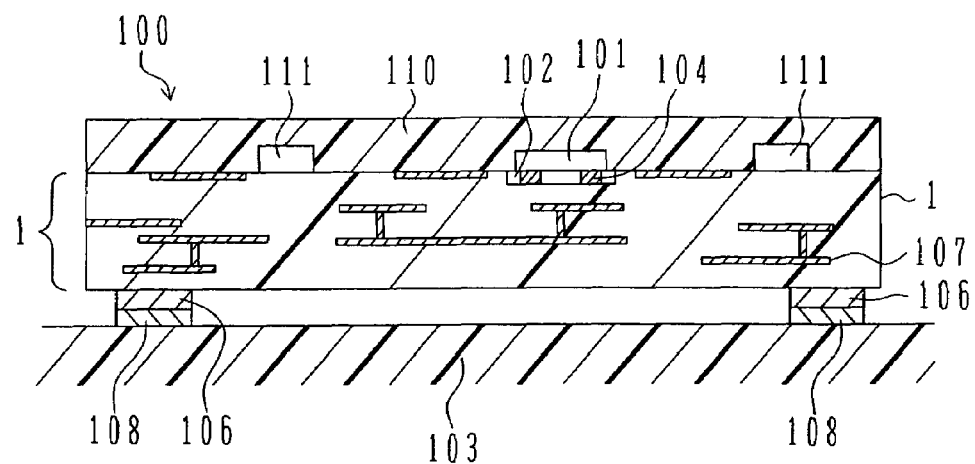
FIG. 2 is a vertical sectional view showing the partial detailed structure of the semiconductor module according to one embodiment.

FIG. 1 is a schematic view showing the construction of a semiconductor module 100 according to one embodiment of the present invention, and FIG. 2 is a vertical sectional view taken along a line A-A' in FIG. 1. The semiconductor module 100 of this embodiment has a thickness of about 0.45 mm.

Referring to FIGS. 1 and 2, a glass-ceramic substrate 1 is of a multilayered structure in which patterned wires 107 for transmission are formed between multiple layers and passive parts 111, such as capacitors, resistances and inductors, are formed on the substrate. Also, the substrate 1 has a recess 102 in which a MOSFET device 101 (hereinafter referred to simply as the "MOSFET") made of a semiconductor material is to be mounted.

The substrate 1 is mounted on a circuit board 103. Au bumps 104 are used for electrical connection between the MOSFET 101 and the substrate 1, and are each made up of Au particles having an average particle size of 5 nm. Electrodes 108 are formed on the circuit board 103 and are electrically connected to the substrate 1 through Sn-based brazing pastes 106. On the substrate 1, the passive parts 111, such as capacitors, solenoids and resistances, are mounted through metallic brazing pastes (not shown). An epoxy resin 110 covers the passive parts 111, such as capacitors, solenoids and resistances, and the MOSFET 101, all of which are mounted on the substrate 1.

Figure 3:
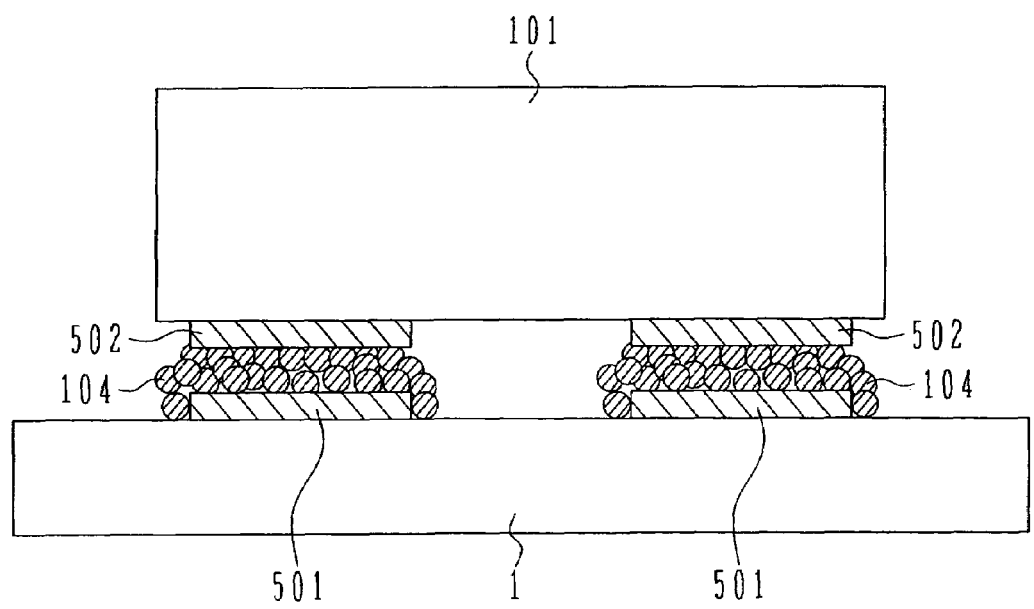
FIG. 3 is an enlarged view of bonded portions between a MOSFET device and a substrate shown in FIG. 2.

FIG. 3 is an enlarged view of bonded portions between the MOSFET 101 and the substrate 1 shown in FIG. 2, the view showing the bonded portions given by the Au bumps 104 in more detail. The Au bumps 104 are each made up of Au particles having an average particle size of 5 nm and cover electrodes 501. The electrodes 501 formed on the substrate 1 are made of Ni, have surfaces coated with Au, and are connected to the patterned wires 107 inside the substrate 1. The surfaces of electrodes 502 formed on the MOSFET 101 are coated with Au.

The semiconductor module in this embodiment means an assembly comprising the MOSFET 101, the substrate 1 on which the MOSFET 101 is mounted, the passive parts 111, such as capacitors, solenoids and resistances, which are mounted on the substrate 1, and the epoxy resin 110 covering the passive parts 111 and the MOSFET 101, all of which are mounted on the substrate 1.

A method of manufacturing the semiconductor module of this embodiment will be described below with reference to FIGS. 1 and 2.

The glass-ceramic substrate 1 (with a thickness of 0.30 mm) of the multilayered structure including the patterned wires for transmission and the passive parts, as described above, is prepared by sintering. The recess 102 (see FIG. 2) having a size sufficient to allow mounting of the MOSFET 101 therein is formed in the glass-ceramic substrate 1 at the same time when the glass-ceramic substrate 1 is processed.

The electrodes 501 are formed on a MOSFET mounting surface in the recess 102 and have surfaces plated with Au. On the surface of the glass-ceramic substrate 1 on which the passive parts 111, such as capacitors, solenoids and resistances, are to be mounted, there are formed electrodes for mounting of the passive parts 111, such as capacitors, solenoids and resistances, in respective corresponding positions.

With reference to FIGS. 4(a) to 4(i), a description is now made of a production flow covering steps from mounting of the MOSFET 101 onto the glass-ceramic substrate 1 to mounting of the glass-ceramic substrate 1 onto the circuit (wiring) board 103.

Figure 4A:
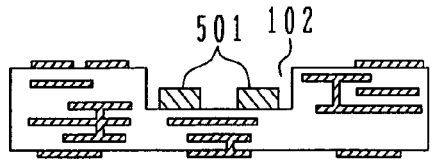
FIGS. 4(a) to 4(i) show a production flow covering steps from mounting of the MOSFET device onto a glass-ceramic substrate to mounting of the glass-ceramic substrate onto a circuit board.
Figure 4B:
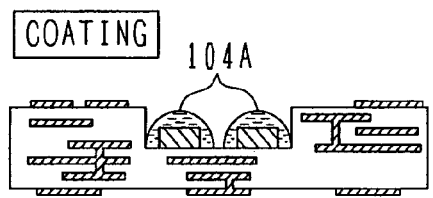
Figure 4C:
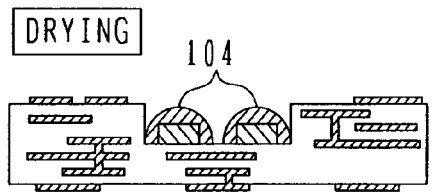

First, a solution 104A containing Au particles having an average particle size of 5 nm is coated by the ink jet method over the Ni electrodes 501, which are formed on the MOSFET mounting surface in the recess 102 of the glass-ceramic substrate 1 and have surfaces coated with Au (FIGS. 4(a) and 4(b)). Then, by drying the coated solution, convex electrodes (bumps) 104 each made up of the Au particles are formed respectively on the Ni electrodes (FIG. 4(c)). In the drying step, heat may be applied, as required, at temperatures in the range of about 30° C. to 80° C.

Figure 4D:
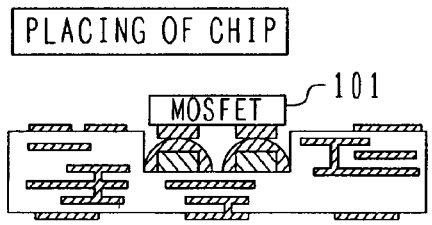
Figure 4E:
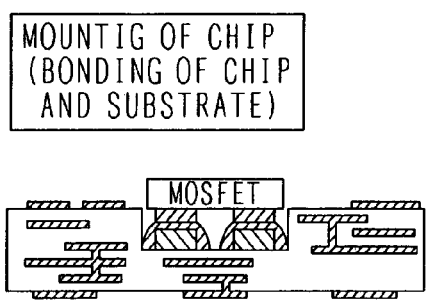
Figure 4F:
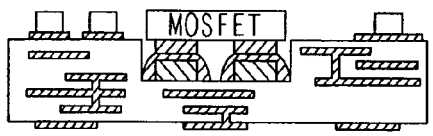
Figure 4G:
Figure 4H:
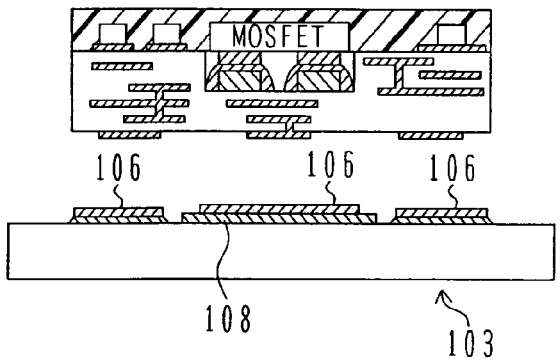
Figure 4I:
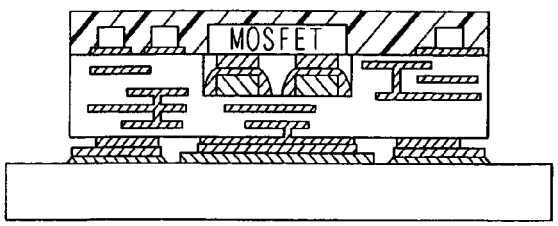

The MOSFET 101 is placed on the Au bumps and is fixedly mounted in the recess 102 of the glass-ceramic substrate 1 to establish electrical connection (FIGS. 4(d) and 4(e)). In this step, heat is applied at temperature of about 80° C. for 60 minutes. Next, the passive parts, such as capacitors, solenoids and resistances, are placed in predetermined positions on the glass-ceramic substrate 1 (FIG. 4(f)) with intervention of brazing pastes (solders) containing 90 percent by weight of Pb and 10 percent by weight of Sn therebetween. These brazing pastes containing Pb as a main component have a higher melting point than brazing pastes, which contain Sn as a main component and are used for mounting the glass-ceramic substrate onto the circuit board.

Then, the passive parts 111, such as capacitors, solenoids and resistances, are brazed at temperature of about 330° C. (FIG. 4(g)). Subsequently, the epoxy resin 110 is poured over the passive parts 111, such as capacitors, solenoids and inductors, which nave been mounted on the glass-ceramic substrate 1, by using a predetermined mold. In such a condition, the epoxy resin 110 is solidified at high temperature of about 120° C.

Then, Sn-based brazing pastes 106 are coated by screen printing over electrodes 108 of the circuit (wiring) board 103, which correspond to an area for mounting of the glass-ceramic substrate 1 on the circuit board. The thickness of the Sn-based brazing pastes applied at that time is about 500 μm. Next, the glass-ceramic substrate 1 including the MOSFET mounted thereon is placed in a predetermined position with precise alignment on the circuit board 103 on which the Sn-based brazing pastes have been printed. Following that, the assembly passes through a reflow furnace at a peak temperature of about 250° C. (FIG. 4(h)). As a result, the mounting of the glass-ceramic substrate 1 including the MOSFET mounted thereon to the circuit board 103 is ended, and a high-frequency power module of this embodiment is completed (FIG. 4(i)).

In this embodiment, because the brazing pastes used for mounting the passive parts 111, such as capacitors, solenoids and resistances, are brazing pastes containing Pb as a main component and having a higher melting point than the Sn-based brazing pastes, the former brazing pastes are never remelted in the step of mounting the glass-ceramic substrate 1.

Alternatively, as in the MOSFET mounting, the passive parts 111 may be each connected by using an Au nano-particle layer instead of the Pb-based brazing paste. In this case, the MOSFET and the passive parts 111 are mounted at the same time. It is preferable that the high-frequency power module has a lower height than any other parts mounted on the same circuit board 103.

To protect the MOSFET against mechanical impacts and chemical changes caused by moisture, etc., a resin is preferably filled in the recess 102 of the glass-ceramic substrate 1 in which the MOSFET is mounted.

Note that FIGS. 1 to 4 show one embodiment of the present invention, and the layout of the various elements is not limited to the illustrated one.

Additionally, an active part, such as the MOSFET, may be mounted in plural number.

In this embodiment, the glass-ceramic substrate 1 may be replaced with any of other suitable multilayered substrates made of alumina, aluminum nitride, glass, and organic materials. Also, in this embodiment, the recess 102 is not always required to be formed in an area of the substrate where an integrated circuit device (such as a MOSFET) is mounted. Further, the semiconductor module may be covered with a cap made of a metal or resin instead of pouring the epoxy resin.

Figure 5:
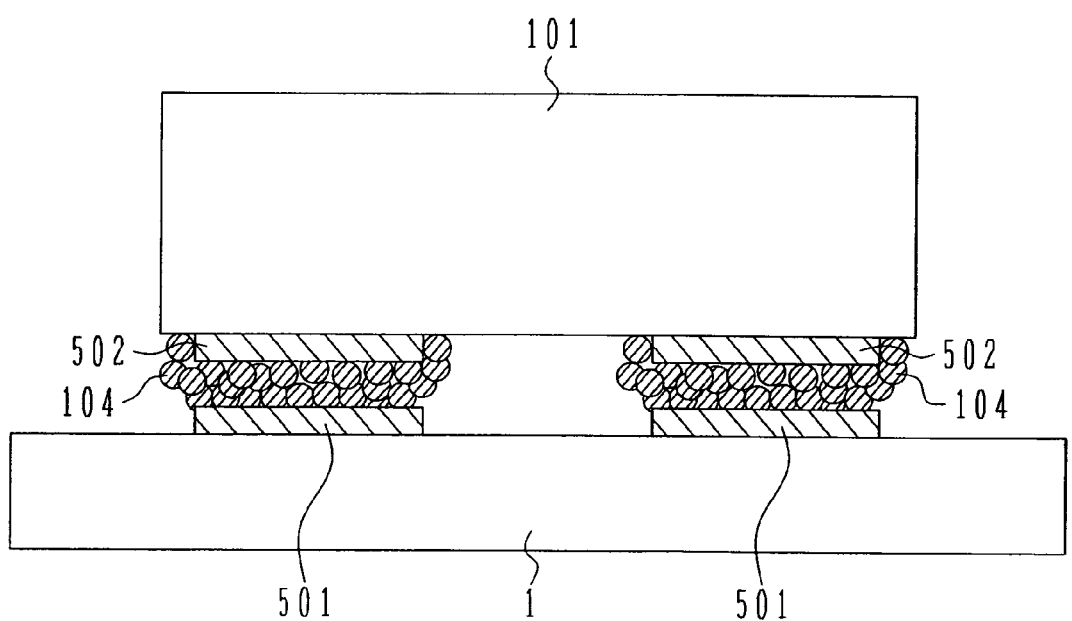
FIG. 5 is an enlarged view of bonded portions between the MOSFET device and the substrate.

The bumps 104 each made up of Au nano-particles may be formed on electrodes of the integrated circuit device (MOSFET). In this case, aggregated layers of the Au nano-particles are formed as shown in FIG. 5. FIG. 5 is an enlarged view of bonded portions between the MOSFET 101 and the substrate 1 in that case, the view showing the bonded portions given by the Au bumps 104 in more detail.

More specifically, the Au bumps 104 are each made up of Au particles having an average particle size of 5 nm. The Ni electrodes 501 are formed on the substrate 1, have surfaces coated with Au, and are connected to the patterned wires 107 inside the substrate 1. The surfaces of electrodes 502 formed on the MOSFET 101 are coated with Au. The Au bumps 104 are formed so as to cover the electrodes 502, respectively.

As described above, the present invention is based on the mounting technique utilizing a novel natural phenomenon that Au nano-particles aggregate on an Au electrode. A resulting aggregated layer is employed as a bonding layer. In this connection, because the semiconductor device, such as the MOSFET, can be bonded to and mounted on the substrate without applying a load, it can be bonded even to electrodes in an active area where wiring required to constitute an electronic circuit for the semiconductor element is already formed.

Figure 6:
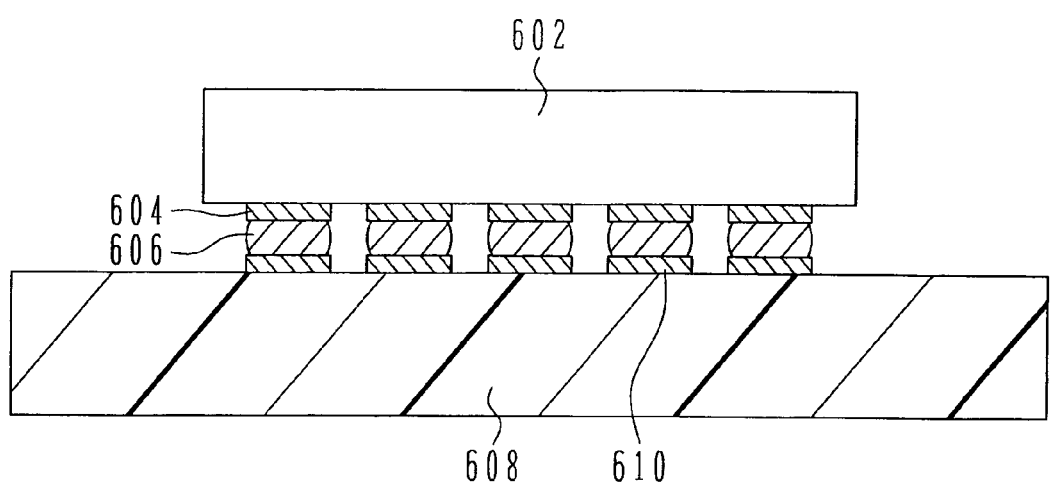
FIG. 6 is a vertical sectional view of a semiconductor element, showing one example in which an aggregated layer is employed as a bonding layer.

FIG. 6 represents one example of that case. Electrode pads 604 having Au-coated surfaces are formed over an entire active area of a semiconductor element 602 and are connected, through bumps 606 each made up of Au nano-particles, to electrode pads 610, which are formed on a substrate 608 and have Au-coated surfaces. Steps of forming the bumps each made up of Au nano-particles and connecting the semiconductor element and the substrate to each other are performed in the same manners as those described above.

Thus, it is possible to arrange bonding electrodes, which have been disposed outside the active area in the past, within the active area, and to realize a size reduction of a semiconductor element, a smaller mounting area, and hence a semiconductor device and an electronic unit each having a reduced thickness. Further, there is no risk of damages caused in the bonding step. This results in a remarkable increase of production yield. Also, in a nano-particle bonding method according to the present invention, the nano-particle layer constituting the bonding layer exhibits properties of a solid metal or a solid metal alloy, and has a high melting point comparable to those of Au and Ag. Therefore, the bonding layer is never remelted at the bonding (mounting) temperature described above. Hence, even when solder pastes having a high melting point are used to mount the glass-ceramic substrate 1 on the circuit board 103 as in this embodiment, the bonding layer are avoided from remelting. In the case of solid-phase bonding with Au bumps formed by the plated bump or stud bump method, a mechanical external force (attributable to pressing or ultrasonic vibration) must be applied in the bonding step. Bonding of the semiconductor element onto the active area is therefore infeasible because of a risk of bonding damages.

While this embodiment employs the solder pastes having a high melting point to mount the glass-ceramic substrate 1 on the circuit board 103, nano-particle aggregated layers may be used instead of those solder pastes. By using the nano-particle aggregated layers of the present invention in a secondary mounting step of mounting the glass-ceramic substrate 1 on the circuit board 103, the connection between both the components can be established at temperatures as low as about 80° C., and there is no fear of remelting of the solder pastes used to mount the semiconductor element, such as the MOSFET, on the substrate. Accordingly, solder pastes having relatively low melting points can be used as the solder pastes in the primary mounting step, thus resulting in a wider range of options in selecting brazing materials.

In the past, when a lead-free solder paste is used, there has been a difficulty in setting the mounting temperature in the secondary mounting step to be lower than the melting point of the lead-free solder paste, and there has been a problem of causing remelting in the secondary mounting step. By using the nano-particle aggregated layer of the present invention as a connecting material for use in the secondary mounting step, it is possible to eliminate the fear of remelting in the secondary mounting step, and to employ the lead-free solder paste as the brazing material for use in the primary mounting step.

The mounting form of the semiconductor element onto the substrate is not limited to the flip-chip structure as described above in this embodiment, and the semiconductor element and the substrate may be connected to each other by wire bonding, etc. Also, the nano-particle aggregated layer of the present invention may be applied to both of the connecting material for use in the primary mounting step and the connecting material for use in the secondary mounting step. In this case, because the connection can be established at relatively low temperatures, thermal strains caused in the components, such as the substrate and the semiconductor element, can be suppressed. Furthermore, the nano-particle aggregated layer is superior in corrosion resistance and contributes to obtaining a semiconductor device with high reliability in connection.

Thus, the nano-particle aggregated layer of the present invention is applicable to any connecting members for use in electronic circuit devices. Also, the semiconductor devices to which the present invention can be applied cover various types including a high-frequency module, a multi-chip module (system-in-package), a ball grid array, and a-chip mounting.

Second Embodiment

A method of manufacturing the semiconductor module of this second embodiment will be described with reference to FIGS. 1 and 2.

The glass-ceramic substrate 1 (with a thickness of 0.30 mm) of the multilayered structure including the patterned wires for transmission and the passive parts formed therein is prepared by sintering. The recess 102 having a size sufficient to allow mounting of the MOSFET 101 therein is formed in the glass-ceramic substrate 1 at the same time when the glass-ceramic substrate 1 is processed.

The depth of the recess 102 is set such that a rear surface of the MOSFET 101 is flush with the surface of the glass-ceramic substrate 1 on the MOSFET mounting side. Metallic patterned wires are formed on a MOSFET mounting surface in the recess 102 and have surfaces plated with Au. On the surface of the glass-ceramic substrate 1 on which the passive parts 111, such as capacitors, solenoids and resistances, are to be mounted, there are formed electrodes and patterned wires for mounting of the passive parts 111, such as capacitors, solenoids and resistances, in respective corresponding positions.

A flow of successive steps for mounting the MOSFET on the glass-ceramic substrate 1 will be described below with reference to FIGS. 7(a) to 7(d), which schematically show, in an enlarged scale, the recess 102 of the glass-ceramic substrate 1.

First, a water repellent (hydrophobic) layer 310 is formed on the MOSFET mounting surface in the recess 102 of the glass-ceramic substrate 1. The water repellent layer is made of, e.g., an amorphous fluorine-containing polymer that has, in its molecule, a perfluoro-polyether chain and an alkoxy silane residual group, or fluoro-alkyl chain and an alkoxy silane residual group.

Figure 7A:
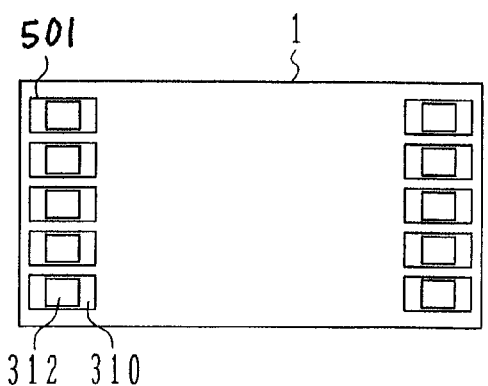
FIGS. 7(a) to 7(d) show a flow of successive steps for mounting of the MOSFET device on the glass-ceramic substrate.

Then, a laser exposure is applied to peel off water repellent films on the Ni electrodes 501 having the Au-coated surfaces, which are formed on the MOSFET mounting surface in the recess 102 of the glass-ceramic substrate 1, so that a hydrophilic area 312 is formed only on the Au-coated Ni electrodes 501 (FIG. 7(a)).

Figure 7B:
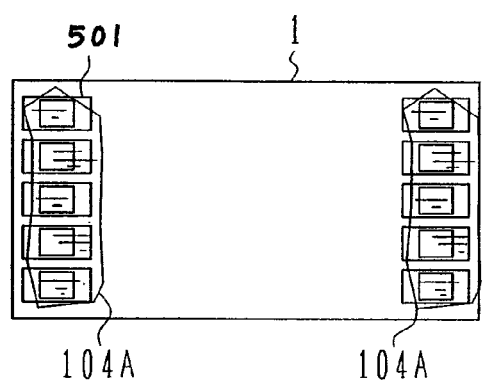
Figure 7C:
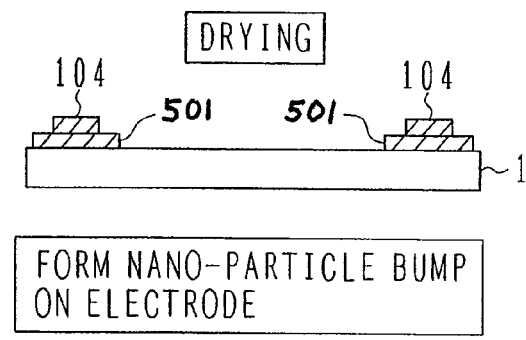
Figure 7D:
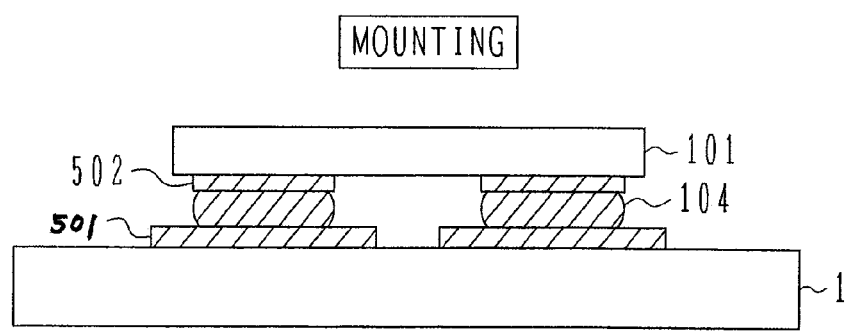

Then, a solution 104A containing Au particles having an average particle size of 5 nm is coated by the ink jet method (FIG. 7(b)). By drying the coated solution, convex electrodes (bumps) 104 each made up of the Au particles are formed respectively on the Ni electrodes 501. In the drying step, heat may be applied, as required, at temperatures in the range of about 30° C. to 80° C. (FIG. 7(c)). The MOSFET 101 is placed on the Au bumps and is fixedly mounted in the recess 102 of the glass-ceramic substrate 1 to establish electrical connection. In this step, heat is applied at temperature of about 80° C. for 60 minutes for positive mounting of the MOSFET 101.

A high-frequency power module of this embodiment is completed by performing subsequent steps of the production flow until the passive parts 111 and the glass-ceramic substrate 1 are mounted on the circuit board 103 in the same manners as those in the first embodiment. In this second embodiment, the glass-ceramic substrate 1 may be replaced with any of other suitable multilayered wiring substrates made of alumina, aluminum nitride, glass, and organic materials. Also, the recess 102 is not always required to be formed in an area of the substrate where an integrated circuit device (such as an MOSFET) is mounted. Further, the semiconductor module may be covered with a cap made of a metal or resin instead of pouring the epoxy resin.

The bumps each made up of Au nano-particles may be formed on electrodes of the integrated circuit device (MOSFET).

According to this second embodiment, as described above, Au nano-particles are caused to locally aggregate by using water repellent layer, and the bonding layer is formed in a shorter time. As a result, this embodiment is effective in reducing the size of an electronic device, increasing production yield with elimination of damages possibly caused in the bonding portions, and realizing higher productivity with shortening of the production time.

Third Embodiment

In this third embodiment, the Au bumps used in the first and second embodiments are replaced with Ag bumps. The embodiments described above are each applicable to manufacturing of a high-frequency power amplifier that is used in a transmitting unit of a cellular cell, etc.

Figure 8:
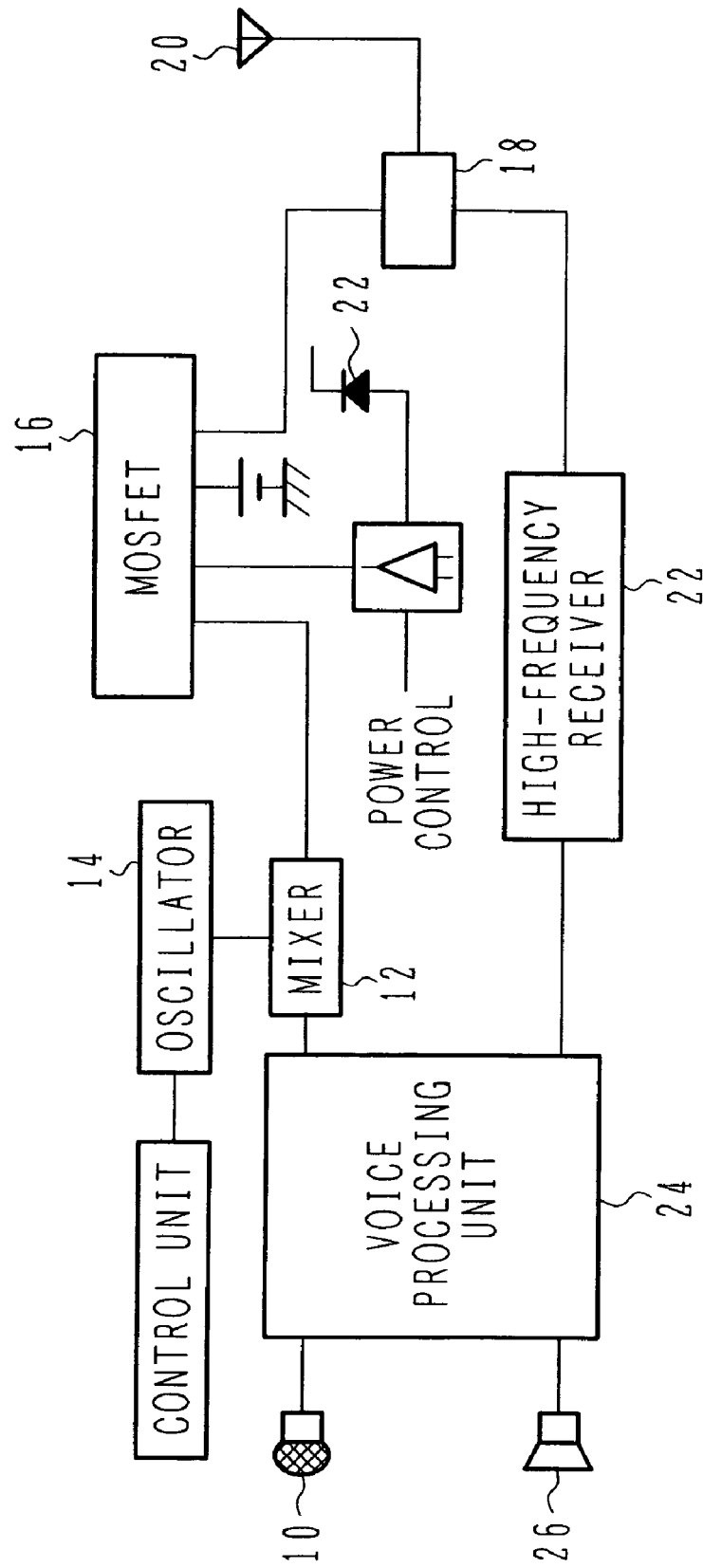
FIG. 8 is a circuit block diagram of a cellular phone in which the semiconductor module according to one embodiment is employed.

FIG. 8 is a circuit block diagram of a cellular phone in which the semiconductor module according to the embodiment is employed. A voice input signal inputted from a microphone 10 is superimposed in a mixer 12 on a high-frequency signal from an oscillator 14, and then transmitted as an electric wave from an antenna 20 through an insulation semiconductor device (MOSFET) 16, which serves as a power amplifier, and an antenna sharing unit 18.

Transmission power is monitored by a coupler 22 and the monitored power is fed back to the insulation semiconductor device 16, which serves as a power amplifier, so that the transmission power is kept constant. Electric waves in a band of 800 to 1000 MHz are used in the illustrated cellular phone. While the above embodiments of the present invention are described in connection with the high-frequency power amplifier, the semiconductor module 100 of the present invention is not limited to the above-described embodiments. A signal received by the antenna 20 is sent to a speaker 26 through a high-frequency receiver 22 and a voice processing unit 24.

Fourth Embodiment

Figure 9A:
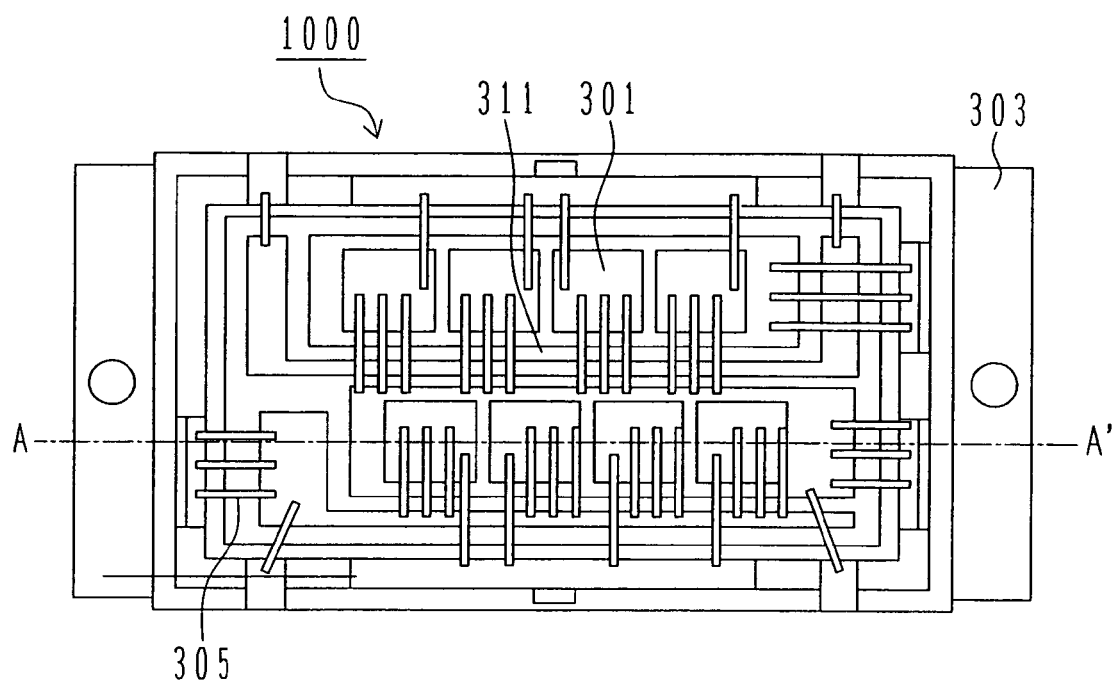
FIGS. 9(a) and 9(b) show the structure of an insulation semiconductor device according to another embodiment of the present invention.
Figure 9B:
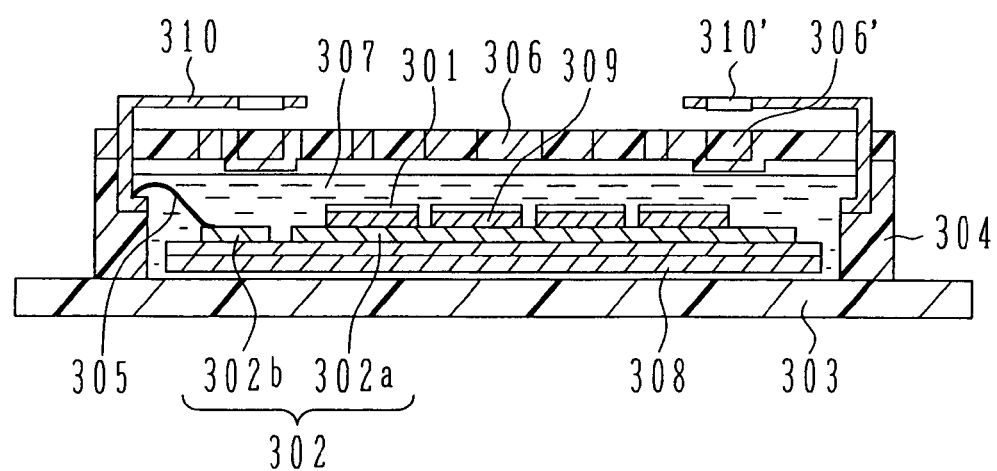

FIGS. 9(a) and 9(b) show the structure of an insulation semiconductor device 1000 according to another embodiment of the present invention. FIG. 9(a) is an upper plan view, and FIG. 9(b) is a sectional view taken along a line A-A' in FIG. 9(a). Semiconductor elements (MOSFET) 301 are mounted on a ceramic insulation substrate 302, and the ceramic insulation substrate 302 is mounted on a base member 303. Then, an epoxy resin case 304, bonding wires 305, and an epoxy resin cap 306 are attached in place, followed by filling a silicone gel resin 307 in the case.

In such a structure, the ceramic insulation substrate 302 is bonded onto the base member 303 through a bonding layer 308 (with a thickness of 100 μm) made up of Au particles having an average particle size of 5 nm. Also, eight MOSFET's 301 (with dimensions of 7 mm×7 mm×0.4 mm) made of Si are bonded onto copper sheets 302a as components of the ceramic insulation substrate 302 through respective bonding layers 309 (with a thickness of 30 μm) each made up of Au particles having an average particle size of 5 nm.

The bonding established through the bonding layers 308 and 309 each made up of Au nano-particles is performed as follows. First, a solution containing Au particles having an average particle size of 5 nm is coated over both of the copper sheets 302a (plated with Ni) of the ceramic insulation substrate 302 and the base member 303.

Then, by drying the coated solution, the bonding layers each made up of the Au nano-particles are formed on the copper sheets 302a (plated with Ni) and the base member 303. In the drying step, heat may be applied, as required, at temperatures in the range of about 30° C. to 80° C.

The semiconductor elements 301 and the ceramic insulation substrate 302 are placed on the corresponding Au bonding layers for connection to the ceramic insulation substrate 302 and the base member 303, respectively. In this connecting step, heat is applied at temperature of about 80° C. for 60 minutes.

A gate electrode, an emitter electrode, etc. of each semiconductor element 301 are connected to corresponding electrodes (copper sheets) 302a, which are formed as an upper portion of the ceramic insulation substrate 302, and terminals 310 attached to the epoxy resin case 304 in advance by wire bonding, i.e., ultrasonic bonding, through Al wires 305 each having a diameter of 300 μm.

Numeral 311 denotes a thermistor for temperature detection, which is brazed to relevant electrodes 302c by using a solder of Sn—3 percent by weight Ag—0.5 percent by weight Cu. The thermistor 311 is led to the exterior by wire bonding through the Al wires 305 each having a diameter of 300 μm, which connect the corresponding electrodes 302c (see FIG. 11) and terminals 310.

The epoxy resin case 304 and the base member 303 are fixed in place by filling a silicone bonding resin (not shown) in a space between them. Recesses 306' are formed in thicker areas of the epoxy resin cap 306, and holes 310' are formed in the terminals 310. Screws (not shown) for connecting the insulation semiconductor device 1000 to an external circuit can be fitted to the recesses 306' and the holes 310'. The terminals 310 are each prepared by punching and shaping a copper plate into a predetermined shape, and then plating the copper plate with Ni. The terminals 310 are attached to the epoxy resin case 304 in predetermined positions.

Figure 10:
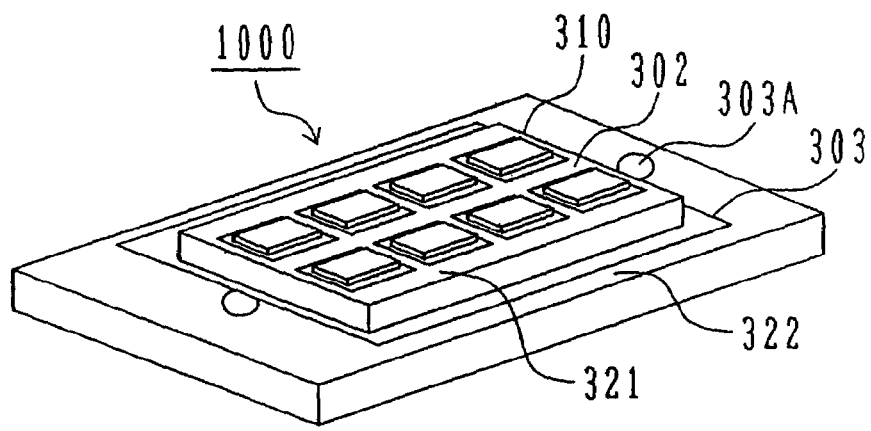
FIG. 10 shows a sub-assembly of the insulation semiconductor device, shown in FIG. 9, according to another embodiment of the present invention.

FIG. 10 shows a sub-assembly of the insulation semiconductor device 1000, shown in FIG. 9, according to another embodiment of the present invention. The ceramic insulation substrate 302 including the semiconductor elements 301 is mounted on the composite member 303 serving as the base member. The base member 303 has dimensions of 74 mm×43 mm×3 mm, and attachment holes 303A (each having a diameter of 5.6 mm) are formed in a peripheral portion of the base member 303. The base member 303 is made of Cu and has a surface plated with Ni in thickness of 203 μm.

The ceramic insulation substrate 302 is mounted on the base member 303 through Au nano-particle layers, and the semiconductor elements (MOSFET's) 301 are mounted on the ceramic insulation substrate 302 through other Au nano-particle layers. Also, a water repellent film 322 is formed on the base member 303 in an mounting area for the ceramic insulation substrate 302 to prevent overflow of the Au nano-particle containing solution when the solution is applied.

Further, a water repellent film 321 is formed on the ceramic insulation substrate 302 in mounting areas for the MOSFET's 301 to prevent overflow of the Au nano-particle containing solution when the solution is applied. The insulation semiconductor device 1000 is a device in a class operating at 100 V and 400 A.

Figure 11A:
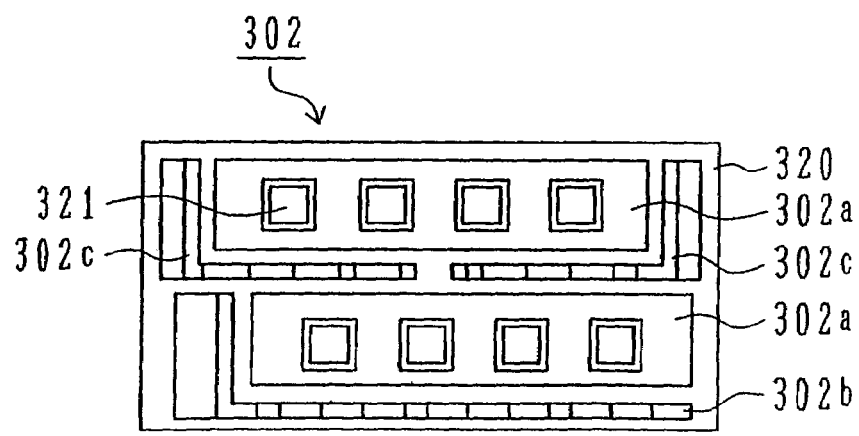
FIGS. 11(a) and 11(b) are a plan view and a sectional view, respectively, for explaining a ceramic insulation substrate in detail.
Figure 11B:
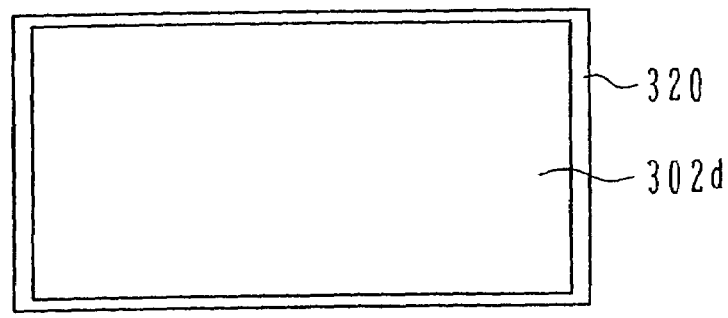

FIGS. 11(*a*) and 11(*b*) are a plan view and a sectional view, respectively, for explaining the ceramic insulation substrate 302 in detail. The ceramic insulation substrate 302 is prepared by bonding, to both surfaces of an AlN-sintered member 220 (with a thermal expansion rate of 4.3 ppm/° C. and a thermal conduction rate of 160 W/m-K) having dimensions of 50 mm×30 mm×0.6 mm, sheets 302*a* (serving also as drain electrodes), 302*b* (serving also as source electrodes) and 302*c* (for mounting of the thermistor) each having a thickness of 300 μm and made of a Cu—Cu$_2$O composite material, as well as a sheet 302*d* having a thickness of 250 μm and made of a Cu—Cu$_2$O composite material by using Ag—Cu brazing pastes (each having, though not shown, a thickness of 20 μn).

The reason of using the Cu—Cu$_2$O composite material as a wiring material to form the respective electrode resides in achieving matching with the thermal expansion rate of the AlN-sintered member 302, and hence ensuring reliability for a long term. Ni-plated coatings (not shown) each having a thickness of 2 μm are formed respective surfaces of the sheets 302*a*, 302*b*, 302*c* and 302*d* each made of the Cu—Cu$_2$O composite material. As a modification, the AlN-sintered member 302 can be replaced with a sintered member of silicon nitride (with a thermal expansion rate of 3.1 ppm/° C. and a thermal conduction rate of 120 W/m·K).

Figure 12:
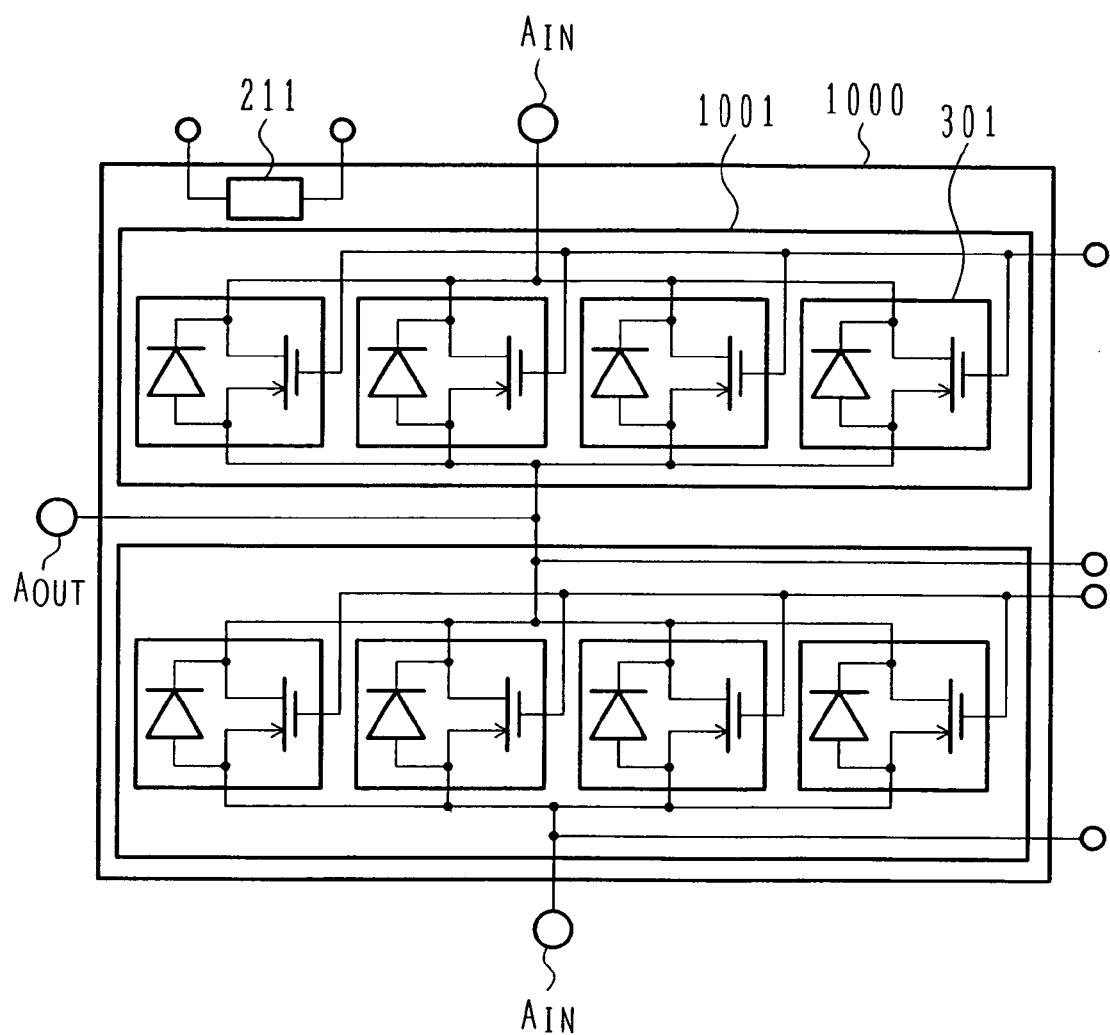
FIG. 12 is a circuit diagram of the insulation semiconductor device according to another embodiment.

FIG. 12 is a circuit diagram of the insulation semiconductor device of this embodiment. Two blocks 1001 each including four MOSFET's 301 arranged in parallel are connected in series and have input terminals Ain, output terminals Aout, etc. led out of the blocks 1001 from respective predetermined positions. Further, the thermistor 311 for detecting the temperature during the operation of the circuit is independently disposed in the insulation semiconductor device 1000.

According to this embodiment of the present invention, as described above, a semiconductor element and a substrate can be mounted respectively on the substrate and a target circuit board at low temperatures through bonding layers each made up of Au nano-particle layers. It is therefore possible to reduce deformations of the substrate and the circuit board and residual stresses caused in the bonding layers after the bonding when the semiconductor element and the substrate are bonded at high temperatures, and hence to increase reliability of the semiconductor device.

Also, according to the nano-particle bonding method in this embodiment of the present invention, the nano-particle layer constituting the bonding layer behaves as a bulk material. Therefore, the bonding layer is never remelted at the bonding temperature described above. Hence, the nano-particle bonding method can also be applied to semiconductor devices employing semiconductor elements which are made of silicon carbide, gallium nitride, etc. and are able to operate under environment at high temperatures.

Further, this embodiment of the present invention employs the mounting based on a novel natural phenomenon that metal particles at a nano-size level aggregate on an electrode. When bonding a semiconductor element and a wire-patterned substrate through a resulting aggregated layer, the bonding can be established at low temperatures without applying a load. As a result, product reliability and production yield can be remarkably increased without causing damages in the bonding step.

Moreover, since the bonding can be achieved with a low load, a semiconductor element can be bonded onto an area where wiring for the semiconductor element is already formed. Consequently, a semiconductor device area can be reduced and hence a smaller-sized electronic device can be provided.

The metal-particle aggregated layer (bonding layer) after the bonding behaves as a bulk material in the form of a metal particle material constituting the bonding layer. Accordingly, when an electronic part mounting the semiconductor element thereon is mounted on the circuit board in this embodiment of the present invention, the joining layer is prevented from remelting even in the case of using a solder paste containing Sn or Pb as a main component. This also contributes to increasing the production yield.

Fifth Embodiment

Figure 13:
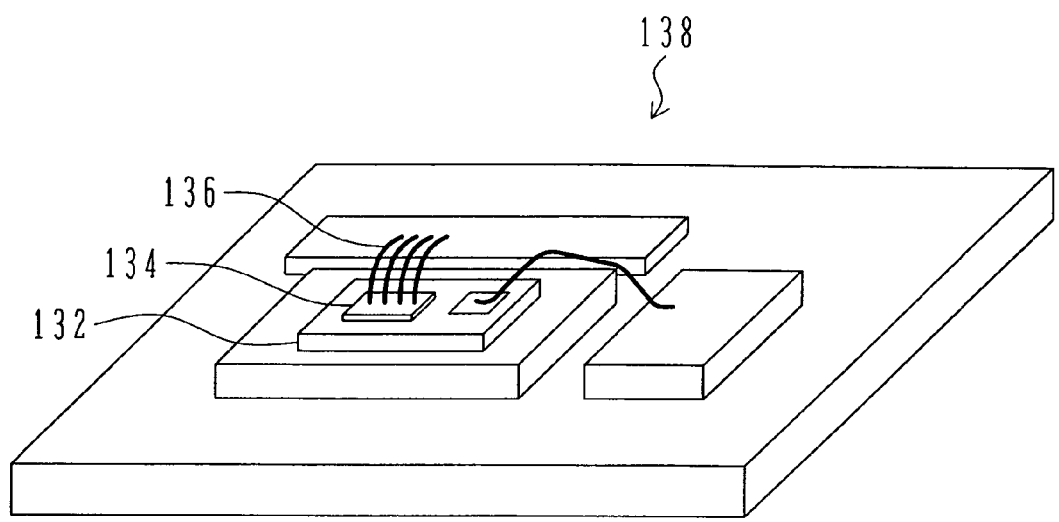
FIG. 13 is a schematic view of an insulation wiring board showing still another embodiment of the present invention.

FIG. 13 is a schematic view of an insulation wiring board in which a metal plate having a stress buffer effect is mounted on an emitter electrode of a semiconductor element constituting an IGBT (Insulated-Gate Bipolar-Power Transistor). More specifically, a stress buffer plate 134 is connected to an emitter electrode of an IGBT chip 132 through an Au nano-particle layer. The stress buffer plate 134 is made of, e.g., Cu, a Cu—Cu$_2$O composite material, a Cu—Mo composite material, a Cu—W composite material, a Cu-Invar-Cu laminated material, or a Cu—C composite material. It is desirable that Ni is plated on the surface of the stress buffer plate 134 and the thickness of a plated coating is in the range of about 0.05 mm to 0.1 mm. The stress buffer plate 134 is bonded to the emitter electrode by the same manner as described above.

Bonding wires 136 are each made of, e.g., pure Al, an Al—Si alloy, or an Al—Si alloy mixed with Ni. In the structure described above, since the stress buffer plate 134 is bonded at low temperatures, residual strains caused between the stress buffer plate .134 and the IGBT chip 132 made of Si. Further, when the IGBT chip 132 including the stress buffer plate 134 bonded thereto is mounted on a wiring board 138 through an Sn-based solder, the Au nano-particle layer serving as a bonding layer between the IGBT chip 132 and the stress buffer plate 134 is never remelted. In addition, connecting the boding wires 136 to the stress buffer plate 134 makes it possible to relieve thermal strains otherwise caused between the Al-based wires and the Si chip, and to increase the life of the connection of the bonding wires.

Figure 14:
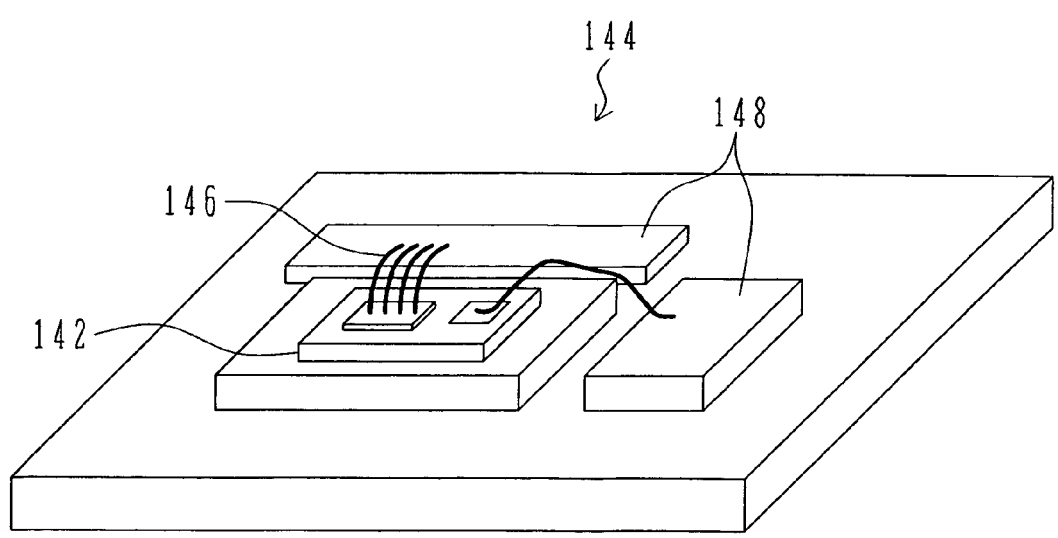
FIG. 14 is a schematic view of an insulation wiring board showing still another embodiment of the present invention.
Figure 15:
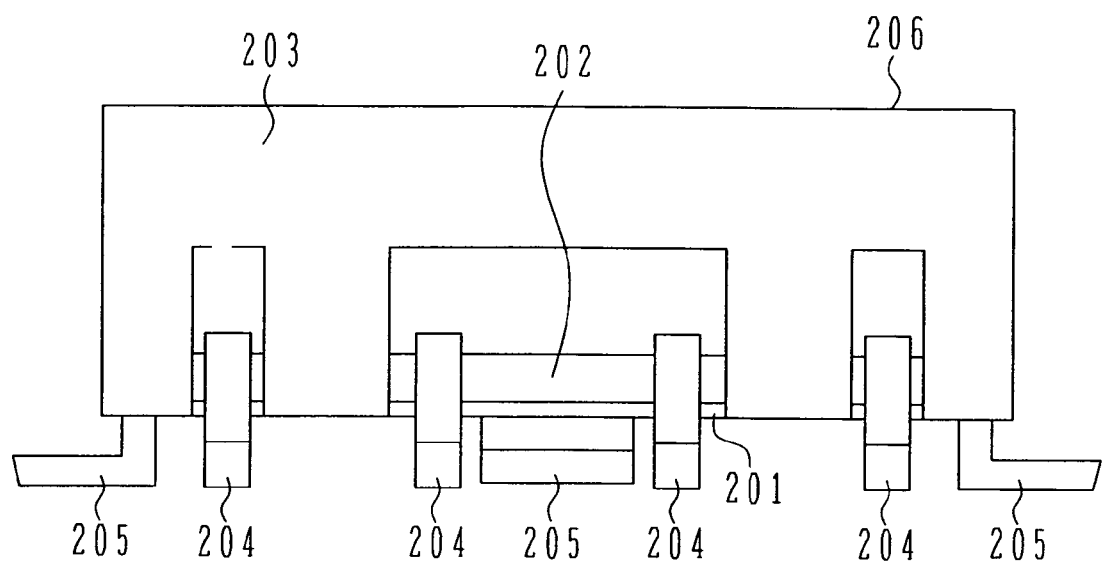
FIG. 15 shows a known semiconductor module.

FIG. 14 is a schematic view of an insulation wiring board on which a semiconductor element made of SiC is mounted. A semiconductor chip 142 is mounted on an insulation wiring board 144 through an Au nano-particle layer. Bonding wires 146 connect the semiconductor chip 142 and patterned wires 148 to each other. In such a structure, since the semiconductor chip 142 is bonded at low temperatures, residual strains caused between the insulation wiring board 144 and the semiconductor chip 142 made of SiC are small. Further, even when the insulation wiring board 144 is put under environment at high temperatures of about 200° C., the Au nano-particle layer serving as a bonding layer between the semiconductor chip 142 and the insulation wiring board 144 is never remelted.

Sixth Embodiment

Figure 16:
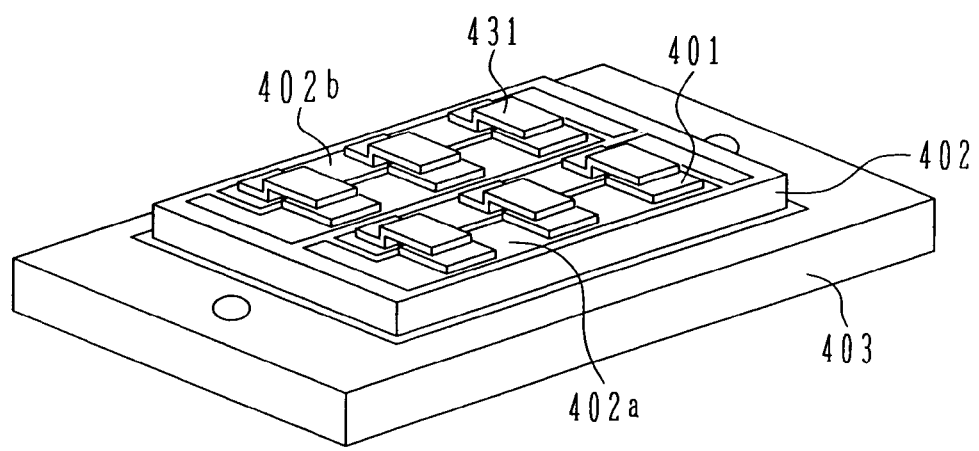
FIG. 16 is a schematic view showing a sub-assembly of an insulation semiconductor device according to still another embodiment of the present invention.

FIG. 16 is a schematic view showing a sub-assembly of an insulation semiconductor device according to still another embodiment of the present invention.

In this embodiment, semiconductor elements 401 and a ceramic insulation substrate 402 are bonded through bonding layers 408 (see FIG. 17) each made up of Au particles having an average particle size of 5 nm. Also, an emitter electrode of each of the semiconductor elements 401 is connected to a copper patterned wire 402b, which is formed on the ceramic insulation substrate 402 and plated with Au and Ni, through a connecting terminal 431 by using Au particle layers 409, 410 (see FIG. 17).

Figure 17:
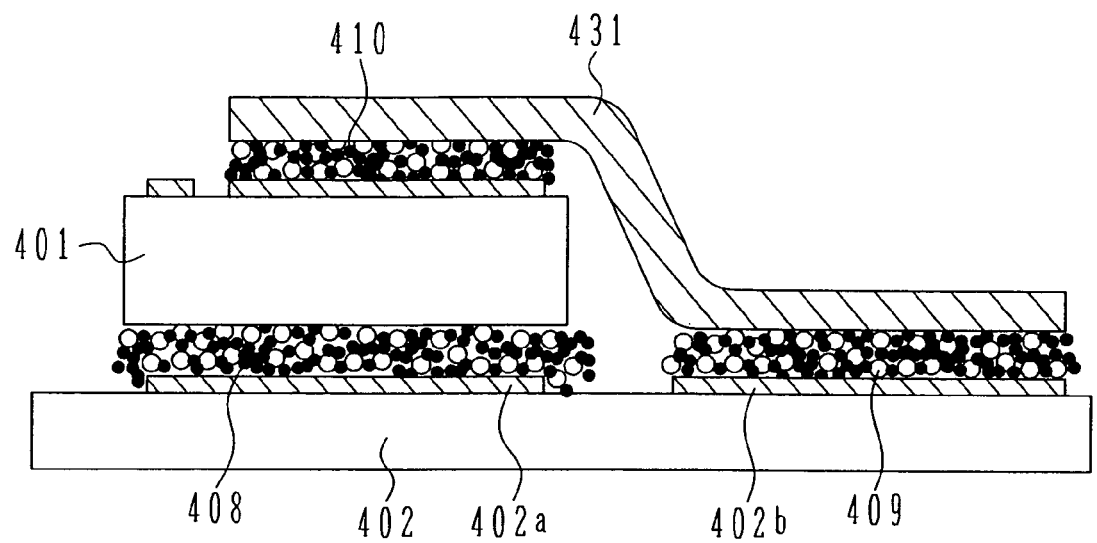
FIG. 17 is a schematic enlarged sectional view of bonded portions among a semiconductor element, a terminal and a patterned wire shown in FIG. 16.

FIG. 17 is a schematic enlarged sectional view of mounting portions of the semiconductor element shown in FIG. 16. The connecting terminal 431 is formed of a copper sheet plated with Ni and then Au on the Ni-plated surface. After bonding each semiconductor element 401 onto a patterned wire 402a on the insulation substrate 402, a solution containing Au particles having an average particle size of 5 nm is coated over the emitter electrode (on the upper side) of the semiconductor element 401. Further, the Au-particle containing solution is also coated over an Au-plated area of a copper patterned wire 402b on the insulation substrate 402, which is formed by Ni-plating a copper wiring pattern on the surface of the insulation substrate 402 and then Au-plating an area of the copper wiring pattern to be connected to the emitter electrode of the semiconductor element 401 through the terminal 431. After drying the Au-particle containing solution coated on both the emitter electrode of the semiconductor element 401 and the copper patterned wire 402b on the insulation substrate 402 to form electrodes made up of the Au particles, the connecting terminal 431 is placed on and mounted to the electrodes made up of the Au particles by applying at temperature of about 80° C. for 60 minutes, the connection between the semiconductor element 401 and the patterned wire 402b is completed. In an insulation semiconductor device, a large current flows in not only a collector electrode, but also en emitter electrode. By using the connecting terminal 431 having a large wiring width, the connection reliability on the emitter electrode side can be further increased.

Seventh Embodiment

This seventh embodiment represents a modified example of the bonding layers used in the first embodiment. The other structure than Au bumps 104, i.e., bonding layers between the MOSFET 101 and the substrate 1, and the method of manufacturing the module are the same as those in the first embodiment.

Figure 18:
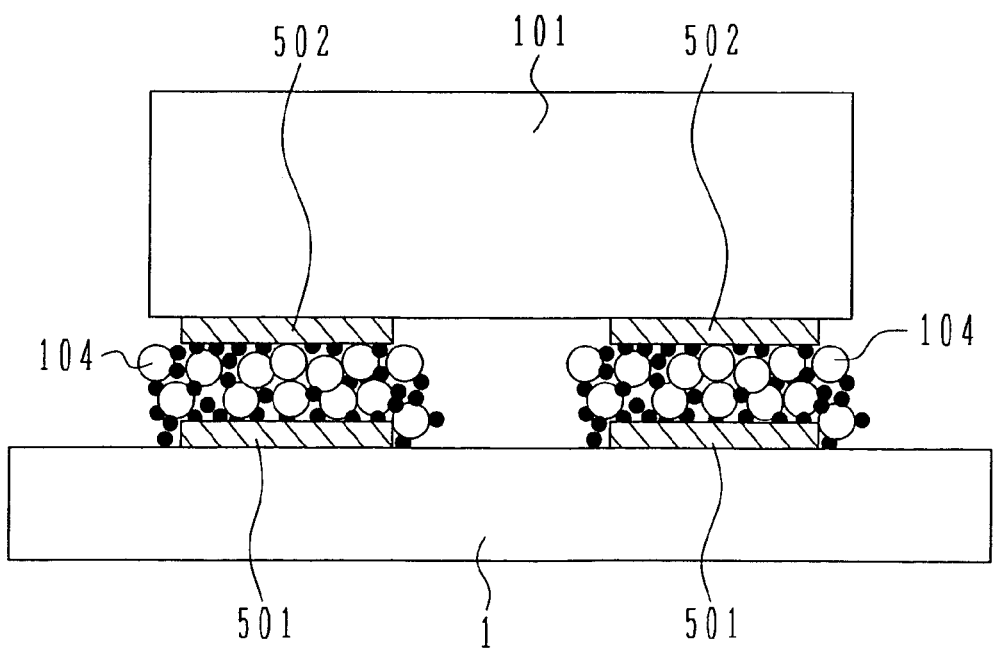
FIG. 18 is an enlarged view of bonded portions between the semiconductor element and the substrate.

FIG. 18 is an enlarged view of bonded portions between the MOSFET 101 and the substrate 1 similar to those shown in FIG. 2, the view showing the bonded portions given by the Au bumps 104 in more detail. The Au bumps 104 are each made of a particle mixture comprising Au particles having an average particle size of 5 nm and Au particles having an average particle size of 20 μm at a volume ratio of 5:1, and they cover electrodes 501 made of Ni. The Ni electrodes 501 are formed on the substrate 1, have surfaces coated with Au, and are connected to the patterned wires 107 inside the substrate 1. The surfaces of electrodes 502 formed on the MOSFET 101 are coated with Au. In this embodiment, a layer made up of Au particles having average particle sizes different from each other is employed as the bonding layer. The bonding layer is preferably formed as a layer made up of minute Au particles in the range of 1 to 50 nm and relatively large Au particles in the range of 1 to 100 μm.

Figure 19:
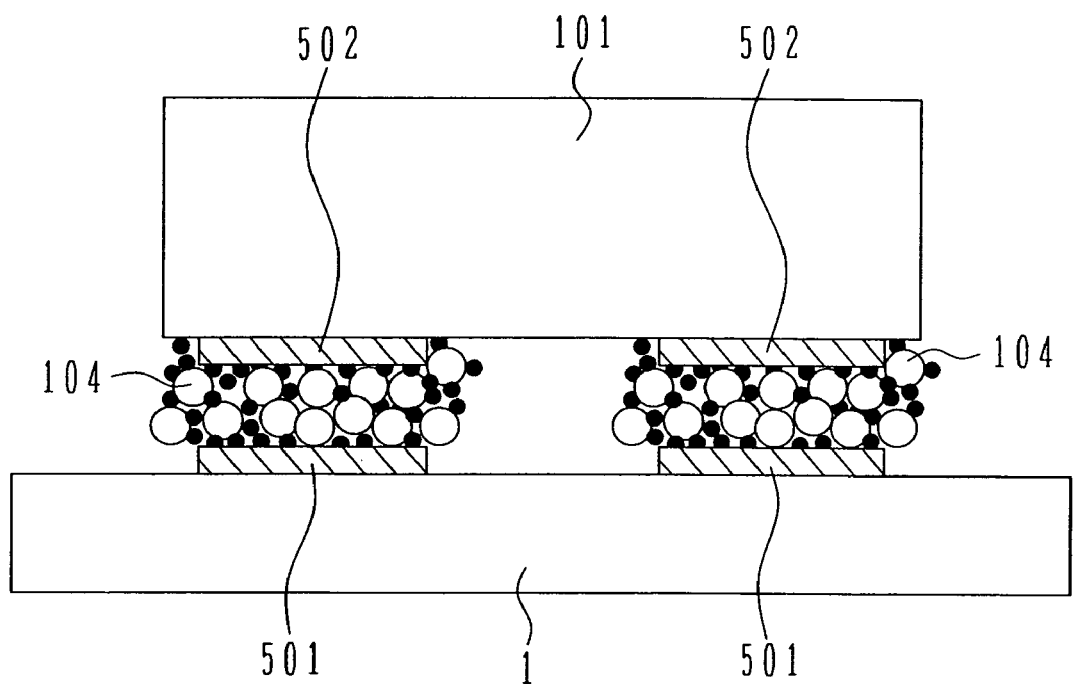
FIG. 19 is an enlarged view of bonded portions between the semiconductor element and the substrate according to another embodiment.

The bumps 104 each made up of Au particles in this embodiment may be formed on electrodes of the integrated circuit device (MOSFET). In this case, aggregated layers of the Au particles are formed as shown in FIG. 19. FIG. 19 is an enlarged view of bonded portions between the MOSFET 101 and the substrate 1 in that case, the view showing the bonded portions given by the Au bumps 104 in more detail. The Au bumps 104 are each made of a particle mixture comprising Au particles having an average particle size of 5 nm and Au particles having an average particle size of 20 μm at a volume ratio of 5:1. The Ni electrodes 501 are formed on the substrate 1, have surfaces coated with Au, and are connected to the patterned wires 107 inside the substrate 1. The surfaces of electrodes 502 formed on the MOSFET 101 are coated with Au. The Au bumps 104 are formed so as to cover the electrodes 502, respectively.

This embodiment utilizes such properties that minute metal particles having an average particle size of 1 to 5 nm tend to aggregate together at temperatures lower than the melting point. By mixing relatively large metal particles having an average particle size of 1 to 100 μm to the minute metal particles, an aggregated layer can be formed in a larger thickness than the case of using only the minute metal particles to form the bonding layer. When there is a large difference in thermal expansion rate between an electronic part and a substrate on which the electronic part is mounted, a thicker bonding layer contributes to releasing thermal stresses caused in the bonded portion due to the difference in thermal expansion rate, and to increasing reliability in the bonded portion.

Further, in the particle coating step, a thicker coating layer can be formed as a result of mixing the relatively large metal particles having an average particle size of 1 to 100 μm. Therefore, defects and other failures are hard to occur in the step of forming the bonding layer, and the life of the bonded portion can be further prolonged. The electrode surface of the substrate and the electrode surface of the electronic part, which are used for bonding between them, have unevenness due to the presence of the patterned wires formed in respective inner layers. This raises a fear that, when the bonding layer is thin, a non-bonded area may occur between the electrode on the substrate and the electrode on the electronic part. Moreover, the electrode on the substrate and the electrode on the electronic part are deformed under influences of the production steps, such as wiring formation and heat treatment, performed in manufacturing the substrate and the electronic part, whereby those electrodes are slightly deviated from the same plane. There is hence a possibility that, when the electrode on the substrate and the electrode on the electronic part are connected to each other, some electrodes having lower heights may remain not connected. To avoid those problems, the minute metal particles having an average particle size of 1 to 5 nm and relatively large metal particles having an average particle size of 1 to 100 μm are used in a mixed form in this embodiment. By mixing the metal particles having a relatively large average particle size, the bonding layer can be coated and formed in a relatively large thickness that has been difficult to obtain with the case of using the minute metal particles, and troubles, such as non-connection and defects in the connected portion, become harder to occur.

The minute metal particles having an average particle size of 1 to 50 nm can be made of at least one kind of metal or an alloy consisting of two or more kinds of metals selected from among gold, silver, copper, platinum, palladium, rhodium, osmium, ruthenium, iridium, iron, tin, zinc, cobalt, nickel, chromium, titanium, tantalum, tungsten, indium, silicon, and aluminum. In particular, preferably, Au, an Au alloy, Ag, and an Ag alloy are used solely or in a mixed form of two or more selected from among them. Also, the relatively large metal particles having an average particle size of 1 to 100 μm can be formed as particles, which are made of Au, an Au alloy, Ag, and/or an Ag alloy, which are formed by plating the surfaces of nickel particles, as cores, with Au, an Au alloy, Ag, and/or an Ag alloy, or which are formed by plating the surfaces of copper particles, as cores, with Ni and further plating the surfaces of Ni-plated coating with Au, an Au alloy, Ag, and/or an Ag alloy. Particles serving as cores can be made of not only a metal, but also a plastic, such as polyimide or polyetherimde, so long as it will neither deform nor decompose even under temperatures applied in the drying and bonding steps performed after coating the particles in a mixed form. In the latter case, the plastic particles can be used through the steps of Ni-plating the surfaces of those particles by the electroless plating method or the electrolytic plating method after forming a conductive film for the plating, and then plating, as in the case of the metal particles, the surfaces of the Ni-plated particles with Au, an Au alloy, Ag, and/or an Ag alloy.

To prevent individual particles from aggregating and cohering together during storage or the coating step, the minute metal particles and the relatively large metal particles are handled and used in a state dispersed in water or a surfactant that interacts with the surfaces of the individual particles and is easily separable at the bonding temperature.

A paste containing the minute metal particles and the relatively large metal particles in a dispersed state can be coated over the electrodes on the substrate or the connected portions of the electronic part by using any of the following methods, namely an ink jet method of ejecting the paste through a thin nozzle; a method of applying the paste to only required areas through a metal mask or a mesh-like mask having openings corresponding to the areas where the paste is to be coated; a method of applying the paste to only required areas by using a dispenser; a method of applying a water repellent resin containing silicone, fluorine or the like through a metal mask or a mesh-like mask having opening corresponding to only the required areas, or applying a photosensitive or water repellent resin onto the substrate or the electronic part and exposing or developing the applied resin to remove it only in the required areas where the paste comprising the minute metal particles and the relatively large metal particles is to be coated, and then coating the bonding paste to the openings; and a method of applying the water repellent resin onto the substrate or the electronic part, removing the coated resin with a laser only in the required areas where the paste comprising the minute metal particles and the relatively large metal particles is to be coated, and then coating the bonding paste to the openings. Those coating methods can be used in a combined way depending on the area and shape of the electrode to be bonded.

It is needless to say that similar advantages to those in this seventh embodiment can also be obtained by employing the bonding layer used in this seventh embodiment as the bonding layers used in the second to sixth embodiments.

Eighth Embodiment

Figure 20:
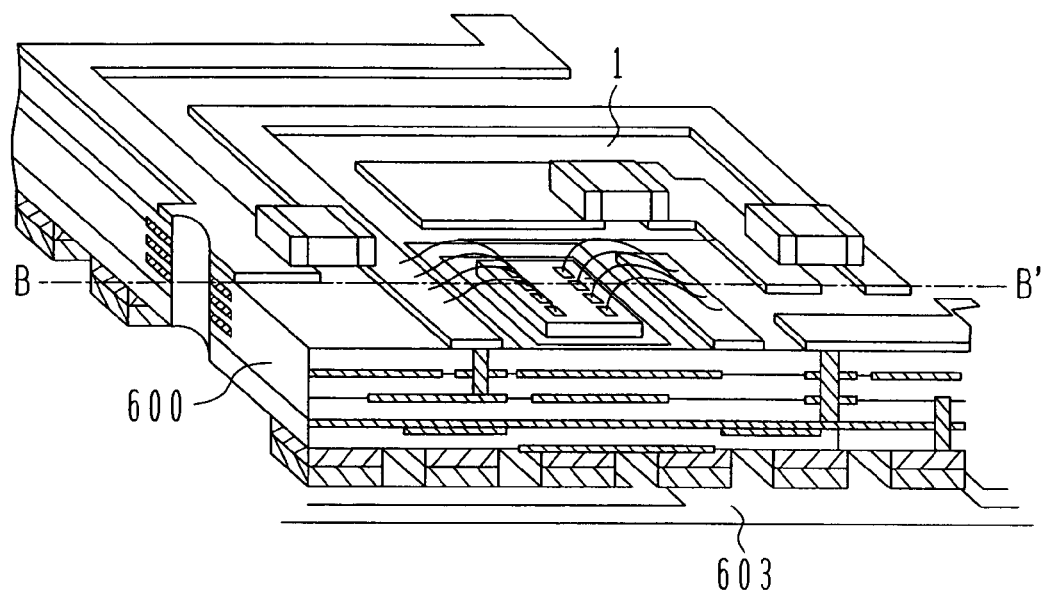
FIG. 20 contains a perspective view and a schematic sectional view showing still another embodiment of the present invention.

A method of manufacturing a semiconductor module according to this eighth embodiment will be described below with reference to FIGS. 20 and 21.

An organic multilayered substrate 600 (with a thickness of 0.30 mm) of the multilayered structure including patterned wires for transmission formed therein is prepared. A recess 602 having a size sufficient to allow mounting of a MOSFET therein is formed in the organic multilayered substrate 600.

Metallic patterned wires are formed on a MOSFET mounting surface in the recess 602 and have surfaces plated with Au. On the surface of the organic multilayered substrate 600 on which passive parts 611, such as capacitors, solenoids and resistances, are to be mounted, there are formed electrodes and patterned wires for mounting of the passive parts 611, such as capacitors, solenoids and resistances, in respective corresponding positions.

A flow of successive steps for mounting of the MOSFET on the organic multilayered substrate 600 will be described below with reference to FIG. 22.

Figure 21:
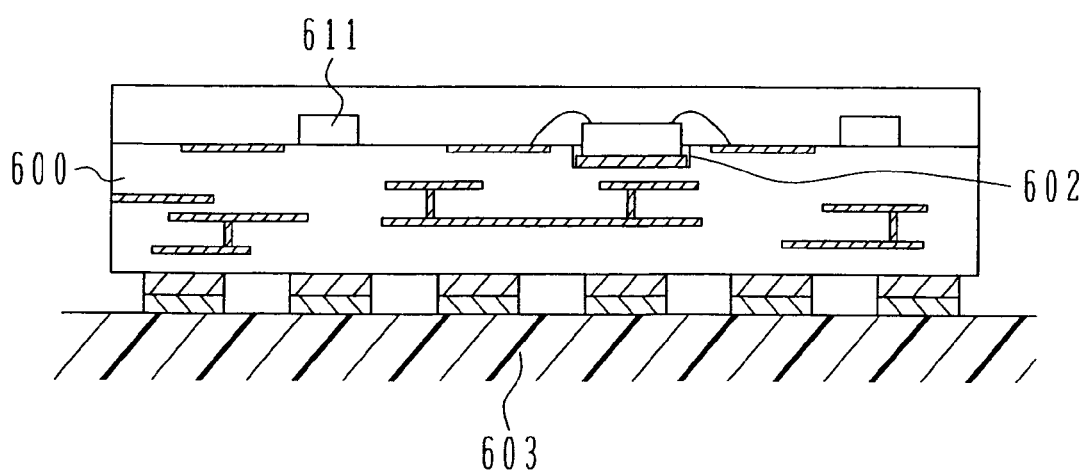
FIG. 21 shows a sectional view along the line of B-B' of FIG. 20.
Figure 22A:
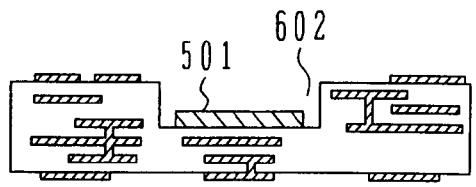
FIG. 22 shows a production flow for mounting of the semiconductor device to an organic multilayered substrate.
Figure 22B:
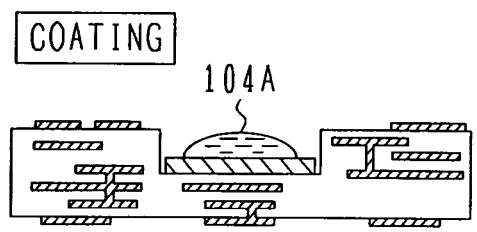
Figure 22C:
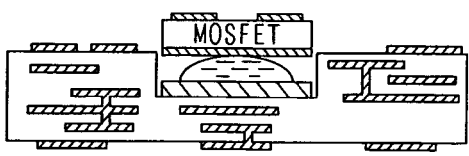
Figure 22D:
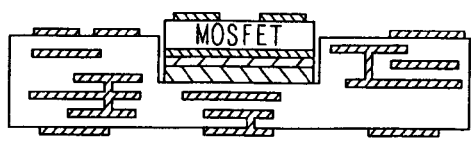

First, a solution 104A containing Au and Ag particles having an average particle size of 5 nm is coated over the metallic patterned wires 501 (serving also as the electrodes) that are formed on the MOSFET mounting surface in the recess 602 of the organic multilayered substrate 600 and have surfaces coated with Au, thereby forming, on the electrodes, convex layers (bumps) each made up of the Au and Ag particles (FIG. 21($a$)). The MOSFET is placed on the Au—Ag bumps and is fixedly mounted in the recess 602 of the organic multilayered substrate 600 (FIG. 21($b$)). In this step, heat is applied at temperature of about 80° C. for 60 minutes for positive mounting of the MOSFET (FIG. 21($c$)).

A high-frequency power module of this embodiment is completed by performing subsequent steps of the production flow until mounting of the passive parts 611 and the organic multilayered substrate 600 onto a circuit board 603 in the same manners as those in the first embodiment. In this eighth embodiment, the organic multilayered substrate 600 may be replaced with any of other suitable multilayered wiring substrates made of alumina, aluminum nitride, glass, and glass ceramics. Also, the recess is not always required to be formed in an area of the substrate where an integrated circuit device (such as a MOSFET) is mounted. Further, the semiconductor module may be covered with a cap made of a metal or resin instead of pouring the epoxy resin. The solder bonded portion may be performed by using solder balls as in a ball grid array (BGA). A distribution ratio of Ag and Au is not limited to a particular value.

As described above, this embodiment represents an example in which the bonding layer made up of Au and Ag mixed minute particles are locally provided, and the bonding can be achieved in a shorter time. Au and Ag do not form a particular compound phase and remain in a full solid solution state. Therefore, contact portions between Au and Ag are free from bonding defects, and hence exhibit good electrical conductivity and thermal conductivity. In addition, the bonding layer containing Au is also effective in suppressing electromigration (ion migration) wherein Ag dissolves in the component exuded from the packaged resin, water intruding from the exterior, etc.

What is claimed is:

1. An electronic part mounting method, comprising:
    coating a metal paste comprised of a liquid containing metal particles that have an average particle size of 1 to 50 nm, on a substrate having an electrode;
    then drying the metal paste by heating the liquid containing the metal particles after the coating step, thereby forming an area made of aggregated metal particles on the electrode surface layer; and
    cooling said substrate after the heating step, placing an electronic part on said area made of the aggregated metal particles, and reheating said area at 50 to 300° C. to bond the metal particles and said electronic part, thereby electrically connecting said electrode on said substrate and said electronic part.

2. An electronic part mounting method according to claim 1, wherein the metal particles form a metal layer having a thickness of 5 to 100 μm.

3. An electronic part mounting method according to claim 1, wherein the metal particles are made of Au, an Au alloy, Ag, or an Ag alloy.

4. An electronic part mounting method according to claim 1, wherein the metal particles include particles comprising cores and coatings formed on core surfaces of said cores.

5. An electronic part mounting method according to claim 4, wherein said cores are Ni particles and core surfaces are plated with Au, an Au alloy, Ag, or an Ag alloy.

6. An electronic part mounting method according to claim 4, wherein said cores are Cu particles, core surfaces are plated with Ni, and Ni-plated surface layers are plated with Au, an Au alloy, Ag, or an Ag alloy.

7. An electronic part mounting method according to claim 5, wherein said cores are particles having characteristics causing neither deformation nor decomposition even under temperatures applied in drying and bonding steps performed after coating the particles on core surfaces.

8. An electronic part mounting method according to claim 6, wherein said cores are particles having characteristics causing neither deformation nor decomposition even under temperatures applied in drying and bonding steps performed after coating the particles on core surfaces.

9. An electronic part mounting method, comprising:
forming a water repellent layer on a substrate having an electrode on a substrate surface;
forming an area where said water repellent layer is removed, at a predetermined position corresponding to said electrode;
coating a metal paste comprised of a liquid containing metal particles, which are made of at least one kind of metal selected from among Au and Ag and have an average particle size of 1 to 50 nm, in said area where said water repellent layer is removed;
then drying the metal paste by heating the liquid after the coating step, thereby forming an area made of aggregated metal particles on said electrode having a surface layer of Au or an Au alloy; and
cooling said substrate after the heating step, placing an electronic part on said area made of the aggregated metal particles, and reheating said area at 50 to 300° C. to bond the metal particles and said electronic part, thereby electrically connecting said electrode on said substrate and said electronic part.

10. An electronic part mounting method according to claim 9, wherein said water repellent layer is made of an amorphous fluorine-containing polymer having, in a molecule thereof, a perfluoro-polyether chain and an alkoxy silane residual group, or fluoro-alkyl chain and an alkoxy silane residual group.

11. An electronic part mounting method according to claim 9, wherein said water repellent layer is made of an amorphous fluorine-containing polymer having, in a molecule thereof, a perfluoro-polyether chain and an alkoxy silane residual group, or fluoro-alkyl chain and an alkoxy silane residual group.

12. An electronic part mounting method, comprising:
forming a recess in one surface of a substrate;
in said recess, coating a metal paste comprised of a liquid containing at least one kind of metal particles that have an average particle size of 1 to 50 nm and are selected from among Au, an Au alloy, Ag, and an Ag alloy;
then drying the metal paste by heating the liquid after the coating step, thereby forming an area made of aggregated metal particles on the surface layer of Au or an Au alloy; and
cooling said substrate after the heating step, placing an electronic part on said area made of the aggregated metal particles, and reheating said area at 50 to 300° C. to bond the metal particles and said electronic part, thereby electrically connecting said electrode on said substrate and said electronic part.

13. A semiconductor module comprising a substrate having an electrode and an electric part, wherein said electrode and said electric part are bonded by the method according to claim 1.

* * * * *